(12) United States Patent
Kohno et al.

(10) Patent No.: US 6,847,579 B2
(45) Date of Patent: Jan. 25, 2005

(54) SEMICONDUCTOR MEMORY DEVICE

(75) Inventors: Fumihiro Kohno, Yokohama (JP); Toshimi Ikeda, Yokohama (JP)

(73) Assignees: Kabushiki Kaisha Toshiba, Tokyo (JP); Fujitsu Limited, Kawasaki (JP)

(*) Notice: Subject to any disclaimer, the term of this patent is extended or adjusted under 35 U.S.C. 154(b) by 179 days.

(21) Appl. No.: 10/133,382

(22) Filed: Apr. 29, 2002

(65) Prior Publication Data

US 2003/0048688 A1 Mar. 13, 2003

(30) Foreign Application Priority Data

Sep. 10, 2001 (JP) ........................................ 2001-273972

(51) Int. Cl.$^7$ .............................. G11C 7/00; G11C 8/00
(52) U.S. Cl. ................... 365/230.06; 365/203; 365/226
(58) Field of Search ............................ 365/230.06, 203, 365/226

(56) References Cited

U.S. PATENT DOCUMENTS

| | | | | |
|---|---|---|---|---|
| 5,604,712 A | * | 2/1997 | Priebe | 365/230.06 |
| 5,825,714 A | | 10/1998 | Kohno | 365/230.06 |
| 6,044,035 A | * | 3/2000 | Kohno | 365/230.06 |
| 6,075,746 A | * | 6/2000 | Ohsawa | 365/230.06 |
| 6,088,289 A | * | 7/2000 | Landry et al. | 365/230.06 |
| 6,115,319 A | * | 9/2000 | Kinoshita et al. | 365/230.06 |

FOREIGN PATENT DOCUMENTS

| | | |
|---|---|---|
| JP | 9-161483 | 6/1997 |
| JP | 11-66840 | 3/1999 |
| KR | 1994-0012392 | 6/1994 |
| KR | 10-0211482 | 5/1999 |

* cited by examiner

*Primary Examiner*—Trong Phan
(74) *Attorney, Agent, or Firm*—Oblon, Spivak, McClelland, Maier & Neustadt, P.C.

(57) ABSTRACT

A semiconductor memory device includes a memory cell array having a plurality of memory cells. The memory cells are arranged at intersections between a plurality of word lines and a plurality of bit lines. The semiconductor memory device also includes a row decoder section located adjacent to the memory cell array. The row decoder section has a plurality of decoder circuits which selectively drive the word lines. The semiconductor memory device further includes a control circuit section located adjacent to the row decoder section. The control circuit section has at least one control circuit whose part is arranged in the row decoder section.

21 Claims, 20 Drawing Sheets

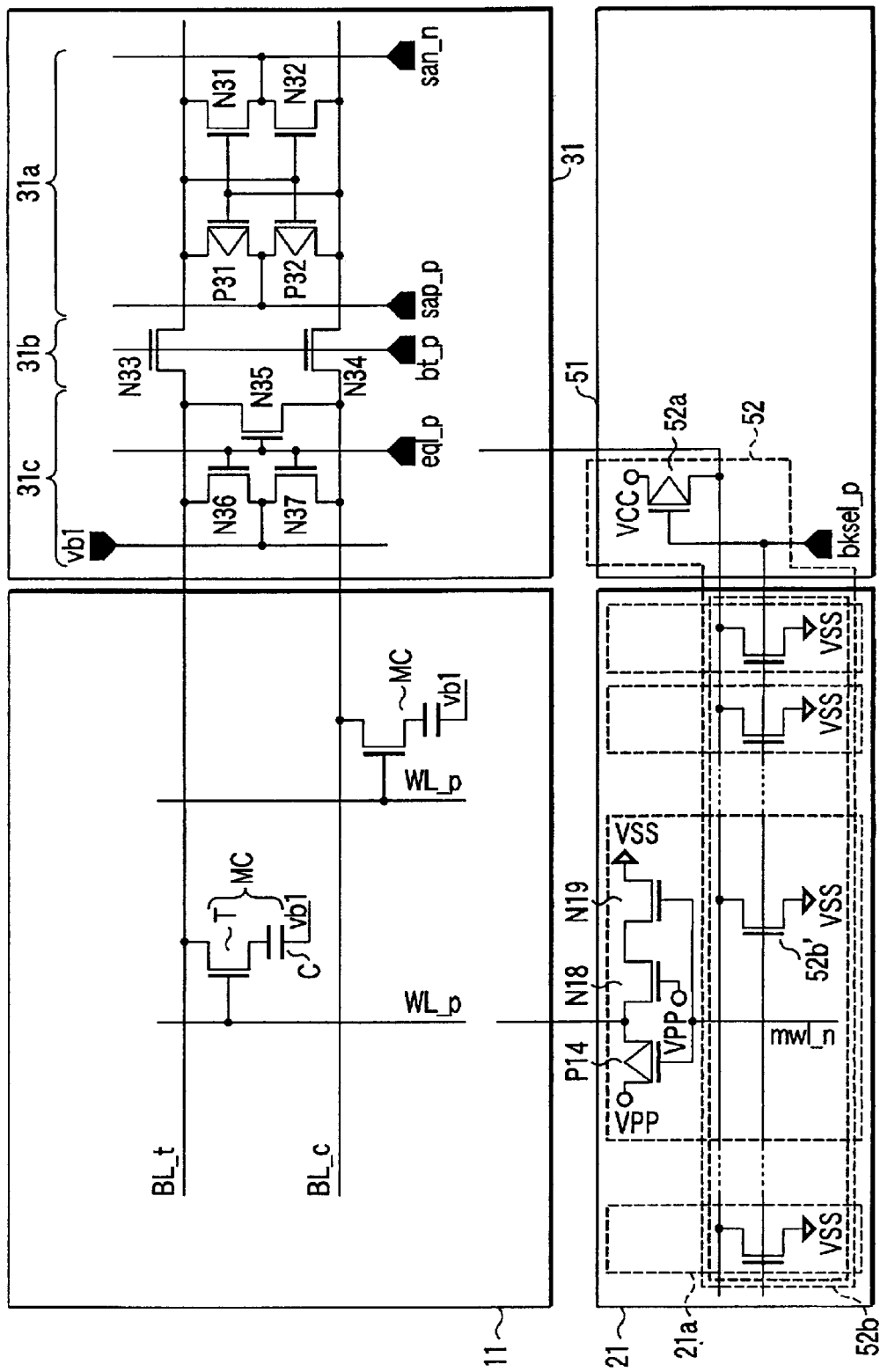
F I G. 1

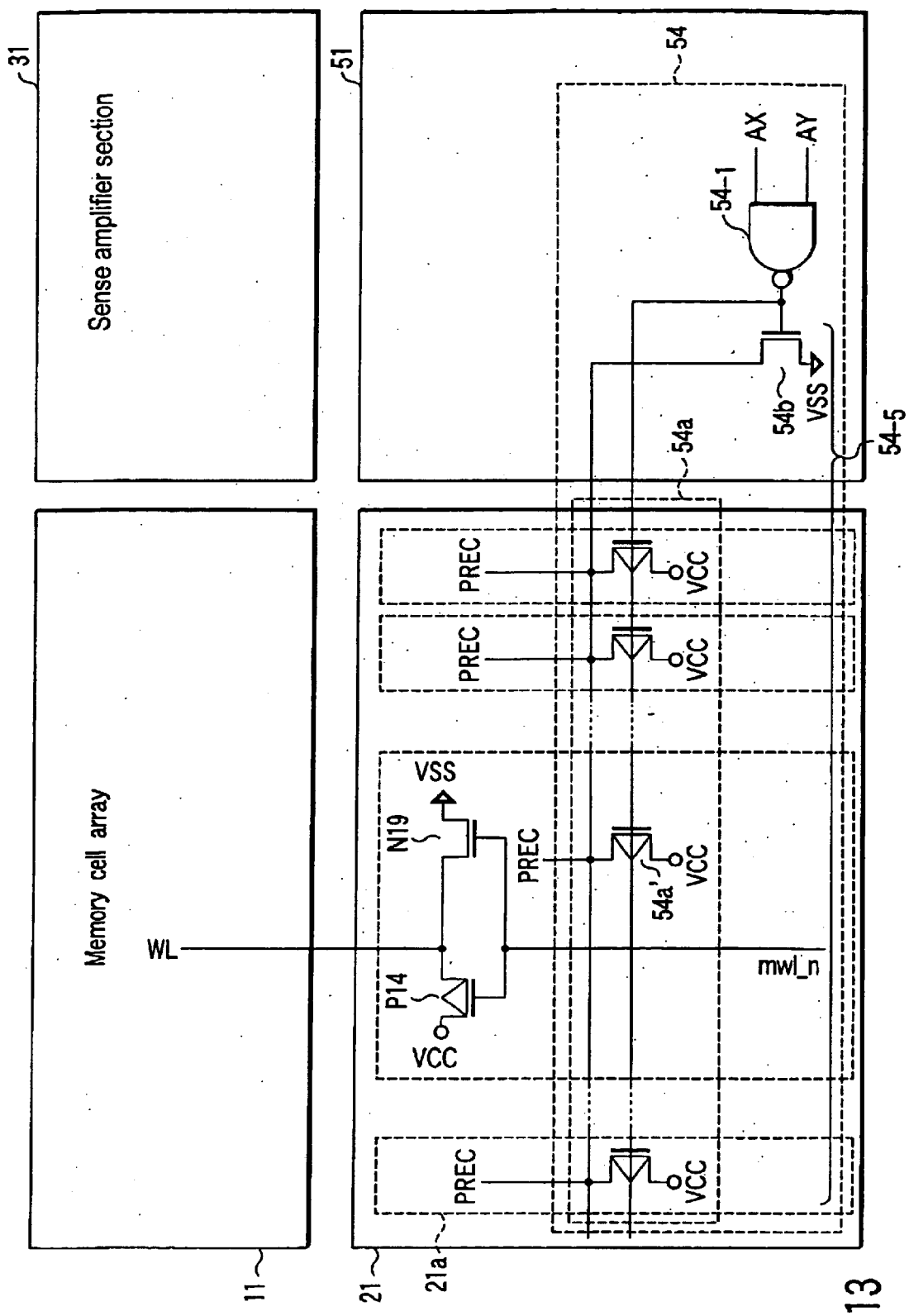
F I G. 13

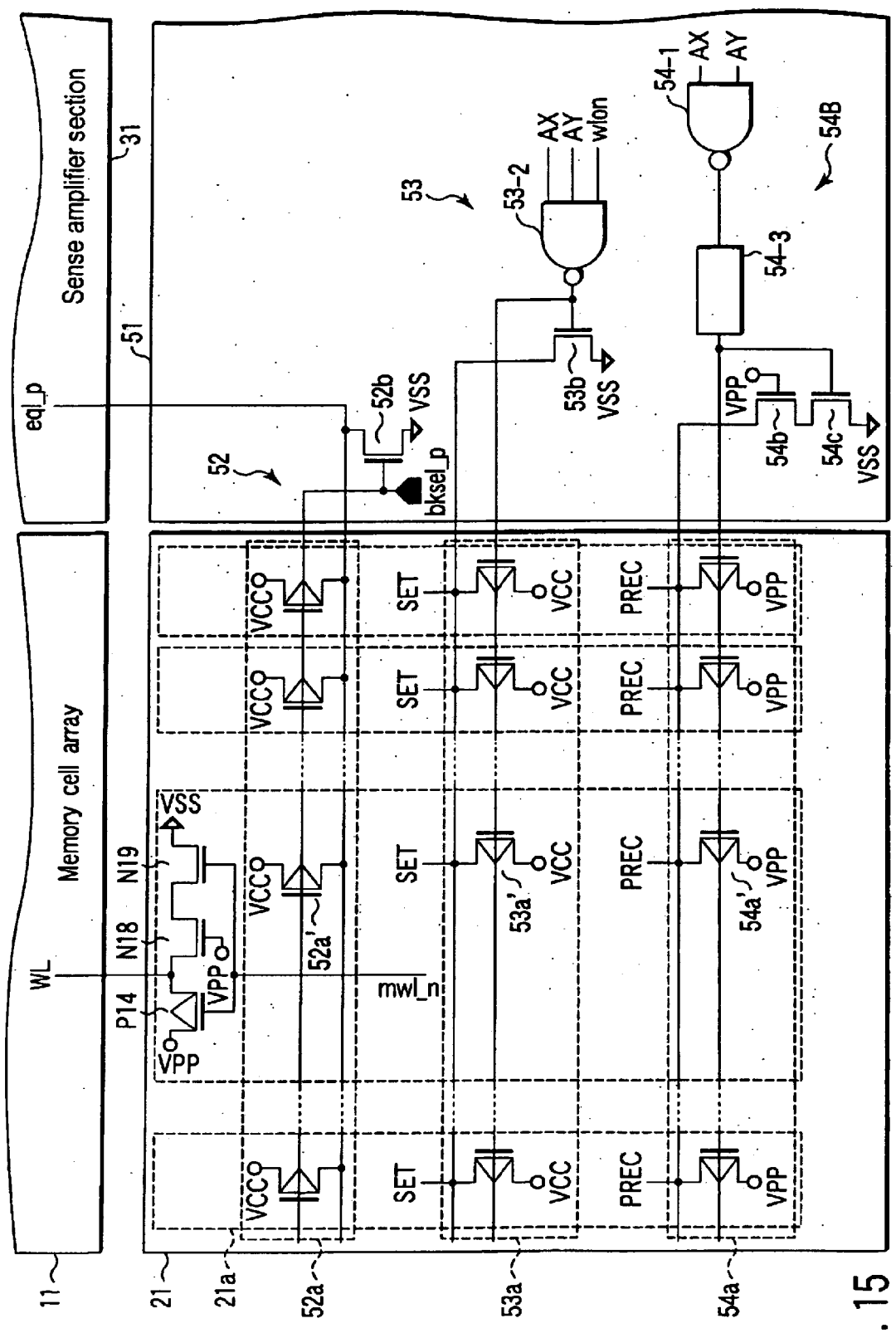
F I G. 15

SEMICONDUCTOR MEMORY DEVICE

CROSS-REFERENCE TO RELATED APPLICATIONS

This application is based upon and claims the benefit of priority from the prior Japanese Patent Application No. 2001-273972, filed Sep. 10, 2001, the entire contents of which are incorporated herein by reference.

BACKGROUND OF THE INVENTION

1. Field of the Invention

The present invention relates to a semiconductor memory device, more specifically to a CMOS (Complementary Metal Oxide Semiconductor) memory which is designed to cope with the problem of hot carriers.

2. Description of the Related Art

In the recent design and development of DRAMs, one kind of semiconductor memories, special importance is attached to the technique of laying out row decoder sections to be as small as possible.

FIG. 17 shows an example of the core portion of a general DRAM. As shown in FIG. 17, the DRAM includes a plurality of memory cell arrays 11. Each memory cell array 11 includes a plurality of memory cells (not shown) arranged in a matrix pattern. In the example shown in FIG. 17, a plurality of word lines WL and a plurality of bit lines BL are arranged so that they intersect one another. One of the memory cells is located at the intersections between the word lines WL and the bit lines BL.

A row decoder section 21 is provided adjacent to each memory cell array 11. The row decoder section 21 includes a plurality of row decoders, by which the word lines WL arranged in rows of each memory cell array 11 are selectively driven.

A sense amplifier section 31 is arranged between two of the memory cell arrays 11 that are adjacent to each other in the row direction. The sense amplifier section 31 is used in common by the two memory cell arrays 11 adjacent to each other in the row direction. The sense amplifier section 31 includes a plurality of sense amplifiers (not shown) which sense the data read out to the bit lines BL.

A plurality of column decoder sections 41 are arrayed in the columnar direction, one for the memory cell arrays 11 of one row. Each column decoder section 41 includes a plurality of column decoders (not shown), by which the bit lines BL arranged in columns are selectively driven.

Control circuit sections 51 are provided in such a manner that one is adjacent to one row decoder section 21. Each control circuit section 51 includes a setting signal-generating circuit, a precharge signal-generating circuit, an equalize signal-generating circuit, etc. The setting signal-generating circuit is used for setting the row decoders. The precharge signal-generating circuit is used for precharging the row decoders. The equalize signal-generating circuit is used for causing a bit equalizer circuit (not shown) of the sense amplifier section 31 to perform an equalizing operation.

When a memory cell is selected in the conventional DRAM, the high-level voltage of the corresponding word line WL is increased to a boosted level (VPP), which is higher than an internal power supply voltage (VCC). By this operation, data can be read out or written at high speed. The use of the boosted voltage results in a high voltage being applied to the gate of a selected transistor connected to a word line WL. As a result, the resistance of the selected transistor lowers. In comparison with the case where the internal power supply voltage is used, a large amount of read current or write current flows to the selected transistor. In this manner, the high-speed data read or write operation is enabled.

At the same time, however, the use of the boosted voltage is accompanied by an increase in the substrate current flowing through a semiconductor substrate. This leads to an increase in the number of hot carriers generated, thus causing adverse effects on a transistor, such as an increase in the threshold voltage, a decrease in the conductance, etc.

In order to suppress the adverse effects the transistor may suffer due to an increase in the number of hot carriers (in short, to lengthen the life of that transistor), the conventional technology uses a technique of connecting a voltage-relaxing transistor in series to the transistor to which the boosted voltage is applied. The life of the transistor is closely related to the substrate current, and it is known in the art that reducing the substrate current to one tenth lengthens the life of the transistor about 1,000 times. The substrate current is an exponential function of the source-drain voltage Vds. Therefore, relaxing the voltage conditions and intensifying the electric field applied to the transistor may be the most effective way for lengthening the life of the transistor. To be more specific, where a plurality of transistors are connected in series, the voltage applied to them can be divided (resistance division), and the voltage applied to each transistor can therefore be divided.

In general, N-channel transistors are more susceptible to hot carriers than P-channel transistors. In a CMOS-type DRAM wherein both an N-channel transistor and a P-channel transistor are provided, it is effective to connect in series a voltage-relaxing transistor only to the N-channel transistor.

FIG. 18 shows an example of a row decoder section which is employed in a CMOS-type DRAM and for which the above-mentioned measure against the hot carriers is taken. In general, a row decoder section is made up of a plurality of decoder circuits (row decoders) arranged in an array, but only one decoder for selecting one word line WL will be described herein, for the sake of simplicity.

Referring to FIG. 18, the row decoder includes the following: a partial-decoder circuit 22 which decodes input addresses BX and BY; two pre-driver circuits 23 and 24 connected to the partial-decoder circuit 22 and used for sequentially inverting an output of the partial-decoder circuit 22; a latch circuit 25 which latches the output from the partial-decoder circuit 22; and a word line driver circuit 26 which drives the word line WL on the basis of an output from pre-driver circuit 24.

The partial-decoder circuit 22 is a precharge/discharge type decoder, and is made up of one P-channel transistor P11 and three N-channel transistors N11–N13. At the end of a precharge period based on input of a precharge signal PREC, the partial-decoder circuit 22 outputs, a decode signal based on the input addresses BX and BY and a multi-bit (e.g., 3-bit) setting signal SET.

The first pre-driver circuit 23 includes one P-channel transistor P12 and two N-channel transistors N14 and N15, and inverts an output of the partial-decoder circuit 22. The second pre-driver circuit 24 includes one P-channel transistor P13 and two N-channel transistors N16 and N17, and inverts an output of the first pre-driver circuit 23.

The latch circuit 25 includes one P-channel transistor P15 and two N-channel transistors N20 and N21. When the pre-charge period of the partial-decoder circuit 22 has ended and after a decode signal based on the input addresses BX and BY has been determined, the latch circuit 25 latches the decode signal and continues to latch it even after the input addresses BX and BY vary. Accordingly, the operation is controlled in accordance with the precharge signal PREC and an output from the pre-driver circuit 23.

The word line driver circuit 26 includes one P-channel transistor P14 and two N-channel transistors N18 and N19, and drives the word line WL in response to an output mwl-n from the pre-driver circuit 24.

With the above configuration, a boosted voltage VPP, which is obtained by boosting the internal power supply voltage VCC, is applied to the sources the P-channel transistors P12, P13, P14 and P15 included in the pre-driver circuits 23 and 24 and latch circuit 25 and word line driver circuit 26. In the case of this row decoder, the boosted voltage VPP is used as a power supply voltage for the pre-driver circuits 23 and 24 and word line driver circuit 26. To decrease the intensity of the electric field applied to the N-channel transistors N15, N17 and N19 of the pre-deriver circuits 23 and 24 and word line driver circuit 26, N-channel transistors (voltage-relaxing transistors) N14, N16 and N18, the gates of which are applied with the boosted voltage VPP, are connected in series to N-channel transistors N15, N17 and N19, respectively.

As described above, voltage-relaxing transistors N14, N16 and N18 are connected in series to N-channel transistors N15, N17 and N19, respectively. In this case, the maximal value of the voltages applied to the sources of N-channel transistors N15, N17 and N19 is expressed by VPP−VthN (VthN is a threshold voltage of the N-channel transistors). Therefore, the voltage Vds applied between the drain and source of each of N-channel transistors N15, N17 and N19 is smaller than the maximal value of the voltage applied to the word line WL, and the voltage difference is VthN. Hence, even if the substrate current increases, adverse effects on a transistor, such as an increase in the threshold voltage or a decrease in the conductance, can be suppressed.

FIG. 19 shows an example of a configuration of an equalize signal-generating circuit 52 of each control circuit section 51. The equalize signal-generating circuit 52 generates equalize signal eql_p on the basis of selection signal bksel_p, and is made, for example, of a CMOS inverter circuit connected between the drains of P-channel and N-channel transistors 52a and 52b for the internal power supply voltage VCC.

FIG. 20 shows an example of a configuration of a setting signal-generating circuit 53 of each control circuit section 51. The setting signal-generating circuit 53 generates setting signal SET on the basis of input addresses AX and AY and a word-line-on signal wlon. For example, the setting signal-generating circuit 53 is made of an inverter circuit 53-1 which includes a P-channel transistor 53a and an N-channel transistor 53b, and a 3-input NAND circuit 53-2 which is controlled on the basis of the input addresses AX and AY and word-line-on signal wlon. The inverter circuit 53-1 is a CMOS circuit operating on the internal power supply voltage VCC, and the drains of its P-channel and N-channel transistors 53a and 53b are connected together.

FIGS. 21A and 21B show examples of configurations of precharge signal-generating circuits 54A and 54B of each control circuit section 51. Each of the precharge signal-generating circuits 54A and 54B generates a precharge signal PREC on the basis of input addresses AX and AY, and is made, for example, of the following: a 2-input NAND circuit 54-1, a level shifting circuit 54-3 (VCC→VPP) and another inverter circuit 54-4. Inverter circuit 54-4 includes one P-channel transistor 54a and two N-channel transistors 54b and 54c, and is a CMOS circuit operating on the boosted voltage VPP.

In the case of precharge signal-generating circuit 54A, the gate of N-channel transistor 54c constituting part of inverter circuit 54-4 is applied with boosted voltage VPP as a fixed voltage. In the case of precharge signal-generating circuit 54B, the gate of N-channel transistor 54b constituting part of inverter circuit 54-4 is applied with boosted voltage VPP as a fixed voltage. Normally, each control circuit section 51 is provided with either one of precharge signal-generating circuit 54A or 54B.

As described above, the layout of the row decoder sections 21 is made as small as possible by including circuits 53, 54A and 54B, which are used for controlling a given row decoder, in the control circuit section 51 adjacent to that row decoder section 21. In addition, circuit 52, which controls the sense amplifier section 31, is also included in that control circuit section 51. As can been seen from this, a large number of circuits are included or laid out within the control circuit section 51, for the purpose of a high-speed operation of chips.

However, with the recent trend toward the miniaturization of DRAMs, the area that can be earmarked for the control circuit section 51 is far narrower than before. Increasing the area of the control circuit section 51 is against the miniaturization of DRAMs. Eventually, the chip size of a DRAM is determined not by the size of the row decoder section 21 but by the area of the control circuit section 51.

BRIEF SUMMARY OF THE INVENTION

According to a first aspect of the invention, there is provided a semiconductor memory device comprising:

a memory cell array including a plurality of memory cells which are arranged at intersections between a plurality of word lines and a plurality of bit lines;

a row decoder section located adjacent to the memory cell array, the row decoder section including a plurality of decoder circuits which selectively drive the word lines; and a control circuit section located adjacent to the row decoder section, the control circuit section including at least one control circuit whose part is arranged in the row decoder section.

BRIEF DESCRIPTION OF THE SEVERAL VIEWS OF THE DRAWING

FIG. 1 is a circuit block diagram showing an example of a DRAM according to the first embodiment of the present invention.

FIG. 13 is a circuit block diagram showing another example of the DRAM shown in FIG. 5.

FIG. 15 is a circuit block diagram showing another example of the DRAM shown in FIG. 7.

DETAILED DESCRIPTION OF THE INVENTION

Embodiments of the present invention will now be described with reference to the accompanying drawings.

(First Embodiment)

Figure 17:
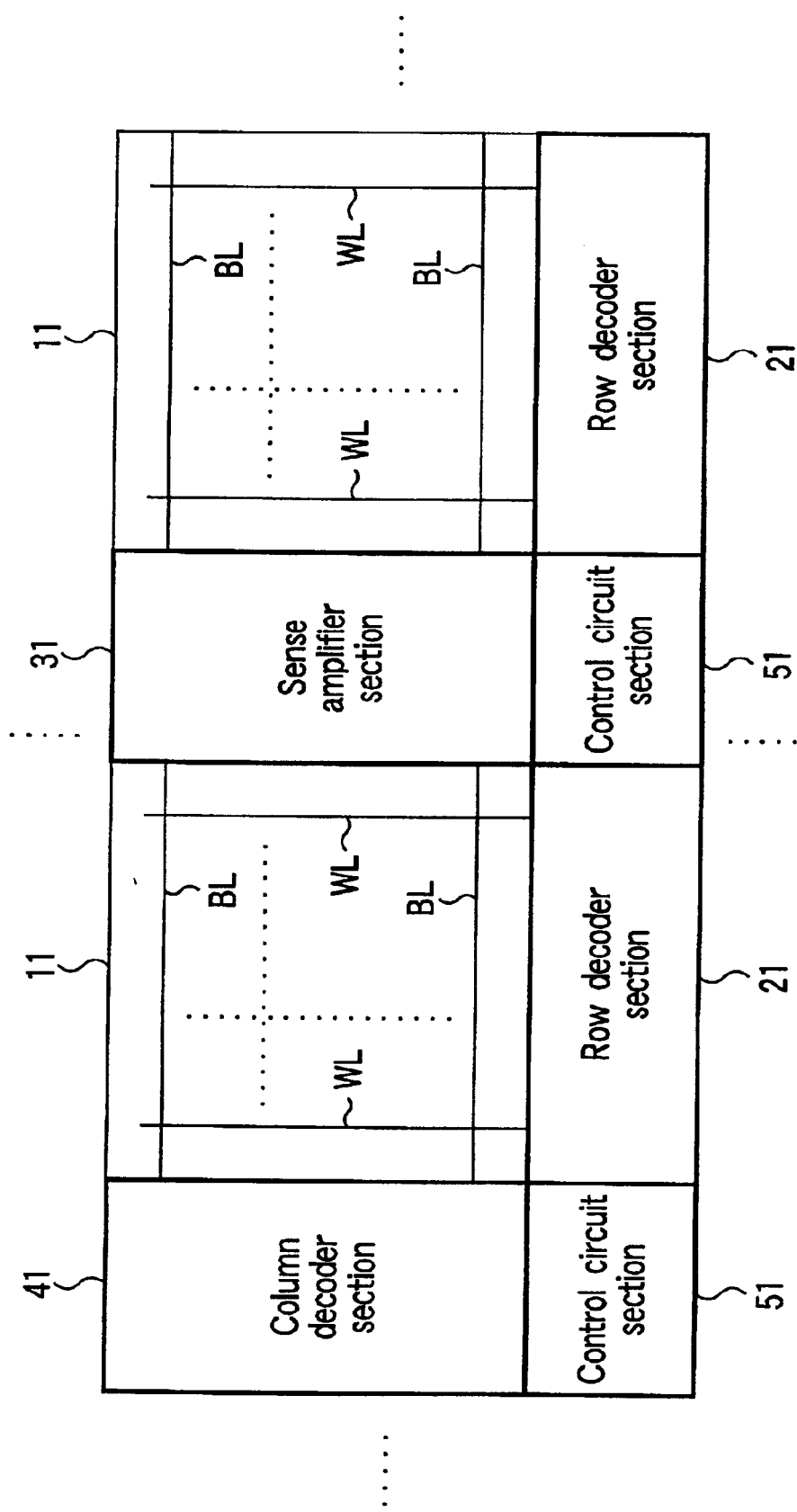
FIG. 17 is a block diagram showing an example of a general DRAM and illustrating the prior art and related problems.

FIG. 1 shows an example of a semiconductor memory device according to the first embodiment of the present invention. In the description below, reference will be made to a CMOS-type DRAM whose core portion is made by dividing part of an equalize signal-generating circuit (which is a control circuit for controlling a sense amplifier section) into circuits and distributively arranging the circuits in a row decoder section. For the sake of simplicity, what is shown in FIG. 1 is limited to one memory cell array 11, one row decoder section 21, one sense amplifier section 31 and one control circuit section 51. In actuality, however, the DRAM comprises a plurality of memory cell arrays 11, a plurality of row decoder sections 21, a plurality of sense amplifier sections 31 and a plurality of control circuit sections 51, as shown in FIG. 17.

As shown in FIG. 1, the memory cell array 11 includes a plurality of memory cells MC arranged in a matrix pattern (FIG. 1 shows only two of them). The memory cells MC are arranged at the intersections between a plurality of word lines WL (word lines WL_p) and a plurality of bit lines BL (bit line pairs BL_t and BL_c). Each of the memory cells MC is made up of one selection transistor T and one data storage capacitor C.

The row decoder section 21 is located adjacent to the memory cell array 11 in the row direction of the DRAM. Details of the row decoder section 21 will be described later.

The sense amplifier section 31 is located between two memory cell arrays 11 that are adjacent to each other in the row direction. With this configuration, one sense amplifier section 31 is used in common by the two adjacent memory cell arrays 11. The sense amplifier section 31 includes a sense amplifier 31a, a bit line-disconnecting circuit 31b and a bit line equalize circuit 31c. These structural elements are provided, each one for one pair of bit lines BL. The sense amplifier 31a includes two N-channel transistors N31 and N32 and two P-channel transistors P31 and P32. The bit line-disconnecting circuit 31b includes two N-channel transistors N33 and N34. The bit line equalize circuit 31c includes three N-channel transistors N35, N36 and N37.

Column decoder sections (not shown) are arranged in the column direction of the DRAM. Each column decoder section is used for the memory cell arrays 11 of one row.

Figure 19:
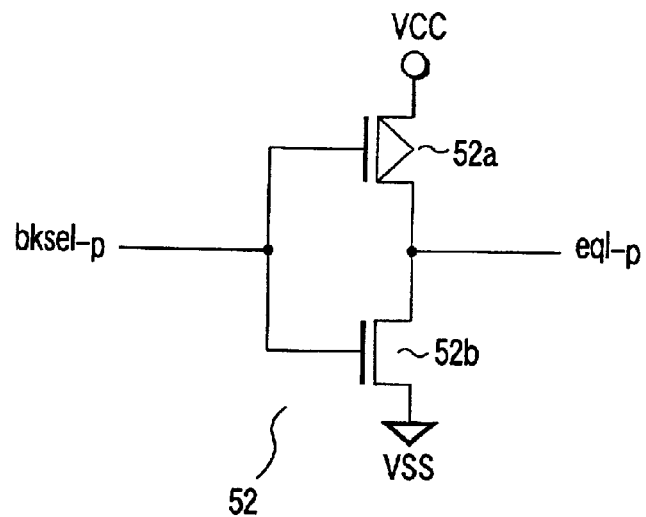
FIG. 19 is a circuit diagram showing an example of a conventional equalize signal-generating circuit.

The control circuit section 51 is provided in such a manner that it is adjacent to the row decoder section 21 in the row direction. The control circuit section 51 includes a P-channel transistor 52a. This P-channel transistor 52a is part of the inverter circuit of the equalize signal-generating circuit 52, which controls the bit line equalize circuit 31c. (With respect to an equalize signal-generating circuit, refer to FIG. 19.) In addition to the P-channel transistor 52a, the control circuit section 51 includes a setting signal-generating circuit which sets row decoders, a precharge signal-generating circuit which precharges the row decoders, etc. (Neither the setting signal-generating circuit nor the precharge signal-generating circuit is shown in FIG. 1.)

The row decoder section 21 includes a plurality of decoder circuits (row decoders) 21a arranged in an array. These decoder circuits 21a are used for selectively driving the word lines WL. The row decoder section 21 also includes N-channel transistor 52b divide into a plurality of N-channel transistors 52b'. The N-channel transistor 52b is part of the inverter circuit of the equalize signal-generating circuit 52. Assuming that the size of the N-channel transistor 52b is W and the number of row decoders 21a is n, the plurality of N-channel transistors 52b' having a size defined by W/n are distributively arranged in the row decoders 21a in an array.

In general, the area of the row decoder section 21 is determined by the arrangement of address lines. In comparison with the number of address lines, the number of row decoders 21a arranged in the row decoder section 21 is small. The row decoder section 21 therefore has a comparatively large number of unused spaces. To make good use of these spaces, part of the equalize signal-generating circuit 52 (namely N-channel transistor 52b) is arranged. With this configuration, the area of the row decoder section 21 need not be changed, and yet the layout size of the control circuit section 51 can be reduced by the size corresponding to N-channel transistor 52b.

The signal amplitude level (voltage level) of the N-channel transistors 52b' arranged in each row decoder 21a is set at the same value as the row decoder 21a. By virtue of this, an increase in the size of the row decoder section 21 can be minimum without the need for well separation or for the arrangement of power supply lines. Moreover, N-channel transistors 52b' are distributively arranged using the repetition of the same pattern (all sizes are set at W/n). By virtue of this, N-channel transistors 52b' can be arranged with comparative ease.

Of the structural elements of the equalize signal-generating circuit 52, N-channel transistor 52b constituting part of the inverter circuit is divided into circuits distributively arranged in the row decoder section 21, with the other structural elements being located in the control circuit section 51. With this configuration, the control circuit section 51 need not be increased in area. Even if the number of circuits to be laid out in the control circuit section 51 is large, the chip size does not have to be increased in accordance with an increase in the area of the control circuit section 51.

The fundamental configuration of each row decoder 21a employed in the present invention is similar to that of a conventional row decoder.

(Second Embodiment)

Figure 2:
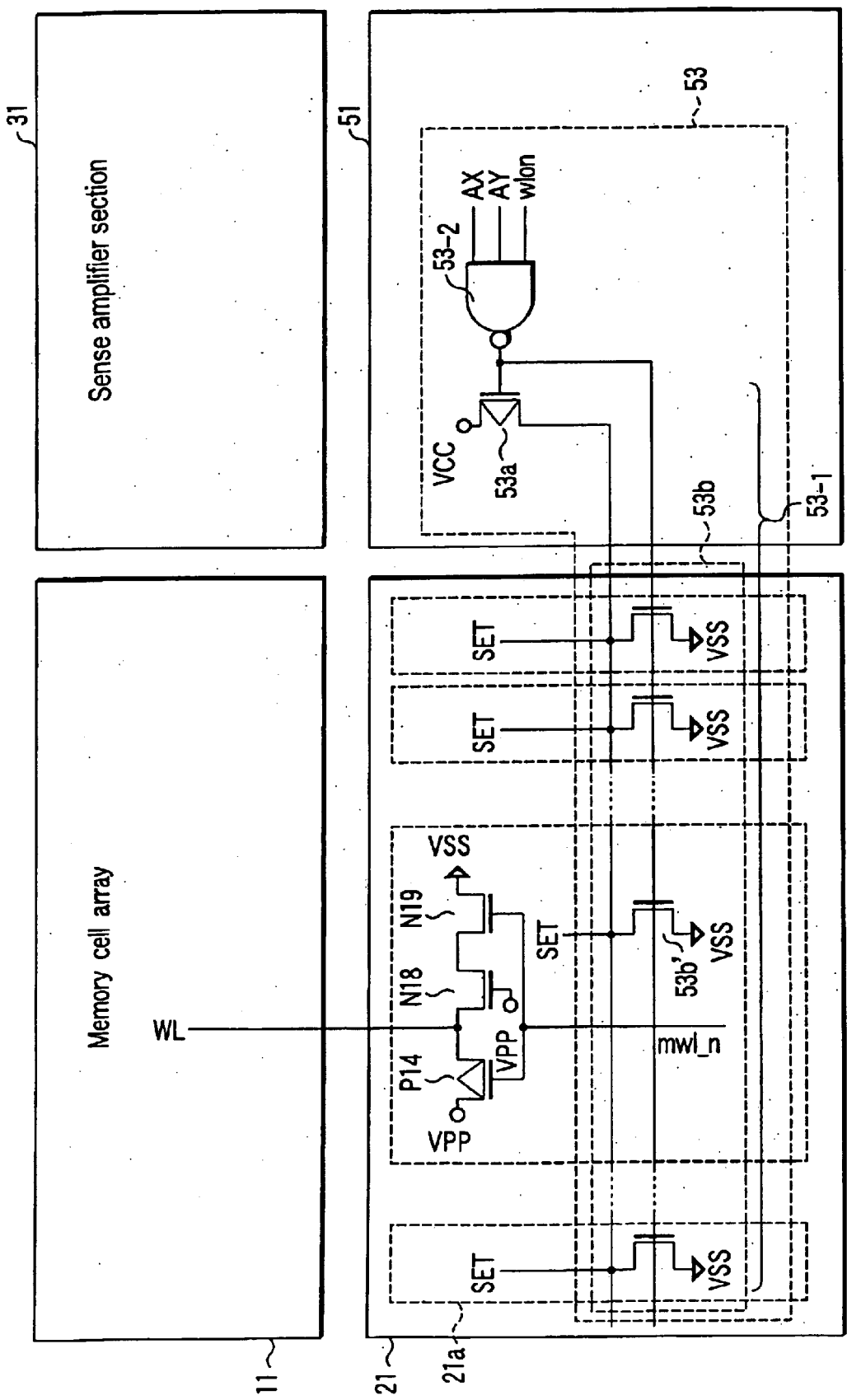
FIG. 2 is a circuit block diagram showing an example of a DRAM according to the second embodiment of the present invention.

FIG. 2 shows an example of a semiconductor memory device according to the second embodiment of the present invention. In the description below, reference will be made to a CMOS-type DRAM whose core portion is made by dividing part of a setting signal-generating circuit (which is a control circuit for controlling row decoders) into circuits and distributively arranging the circuits in a row decoder section. Since the fundamental configuration of the core portion is similar to that of the device shown in FIG. 1, what is shown in FIG. 2 is limited to the major structural elements, for the sake of simplicity.

Figure 20:
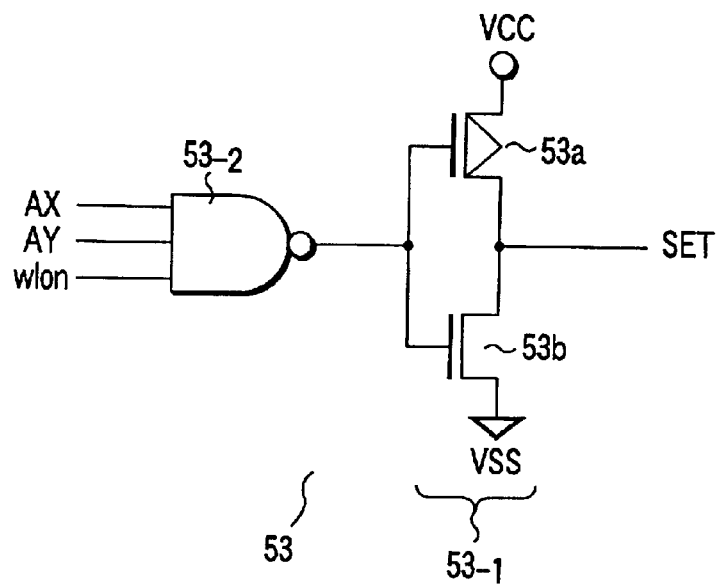
FIG. 20 is a circuit diagram showing an example of a conventional setting signal-generating circuit.

In the case of the second embodiment, the row decoder section 21 includes a N-channel transistor 53b divide into a plurality of N-channel transistors 53b'. The N-channel transistor 53b is part of the inverter circuit 53-1 of a setting signal-generating circuit 53. (With respect to a setting signal-generating circuit 53, refer to FIG. 20.) Except for the N-channel transistor 53b, the setting signal-generating circuit 53 is located inside the control circuit section 51. Assuming that the size of the N-channel transistor 53b is W and the number of row decoders 21a is n, the plurality of N-channel transistors 52b' having a size defined by W/n are distributively arranged in the row decoders 21a in an array.

Of the structural elements of the setting signal-generating circuit 53, N-channel transistor 53b constituting the last inverter circuit 53-1 is divided into circuits distributively arranged in the row decoder section 21, with the other structural elements of the setting signal-generating circuit 53 being located in the control circuit section 51. With this configuration, the control circuit section 51 need not be increased in area, and advantages similar to those of the first embodiment can be attained. That is, even if the number of circuits to be laid out in the control circuit section 51 is large, the chip size does not have to be increased in accordance with an increase in the area of the control circuit section 51.

(Third Embodiment)

Figure 3:
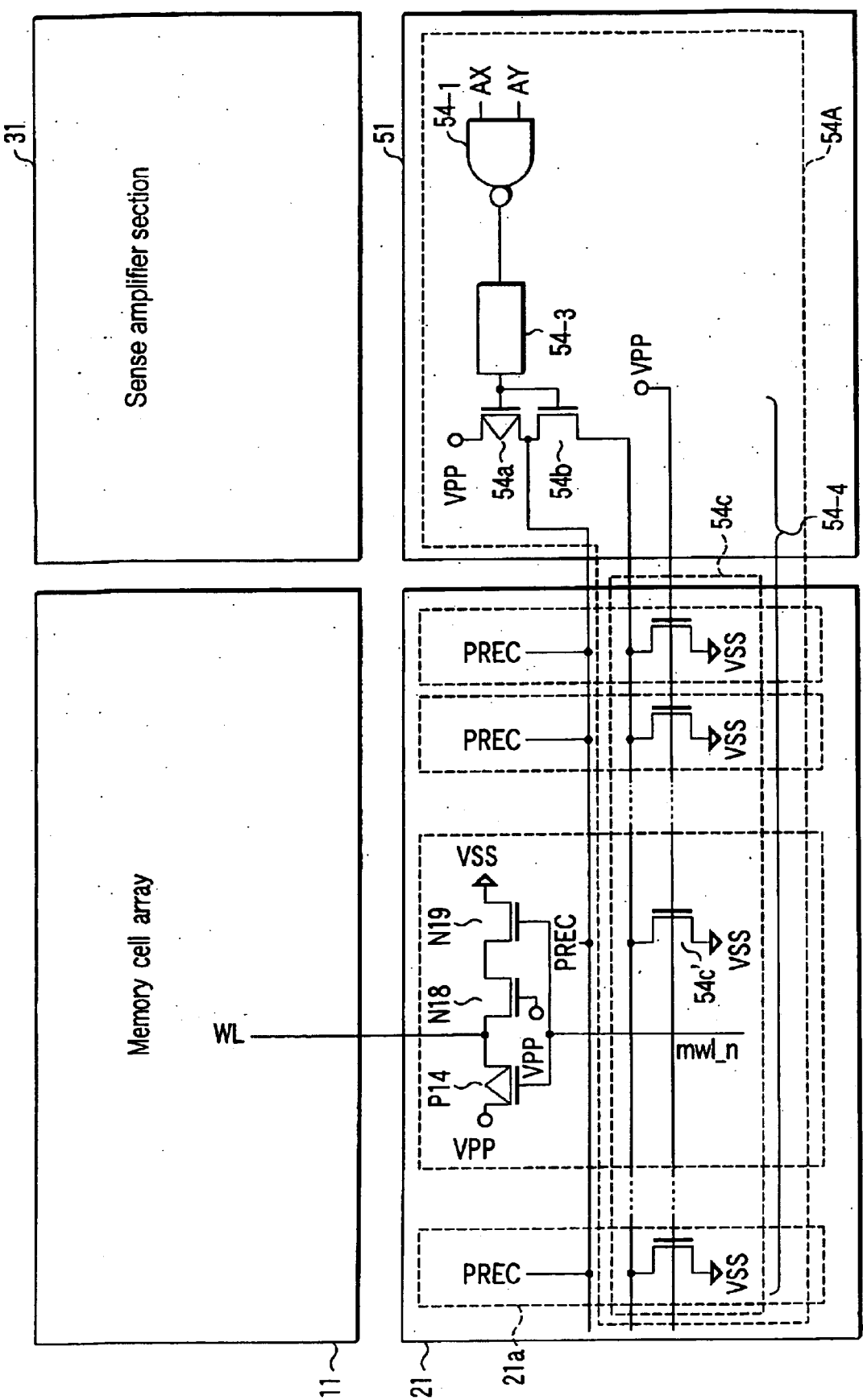
FIG. 3 is a circuit block diagram showing an example of a DRAM according to the third embodiment of the present invention.

FIG. 3 shows an example of a semiconductor memory device according to the third embodiment of the present invention. In the description below, reference will be made to a CMOS-type DRAM whose core portion is made by dividing part of a precharge signal-generating circuit (which is a control circuit for controlling row decoders) into circuits and distributively arranging the circuits in a row decoder section. Since the fundamental configuration of the core portion is similar to that of the device shown in FIG. 1, what is shown in FIG. 3 is limited to the major structural elements, for the sake of simplicity.

Figure 21A:
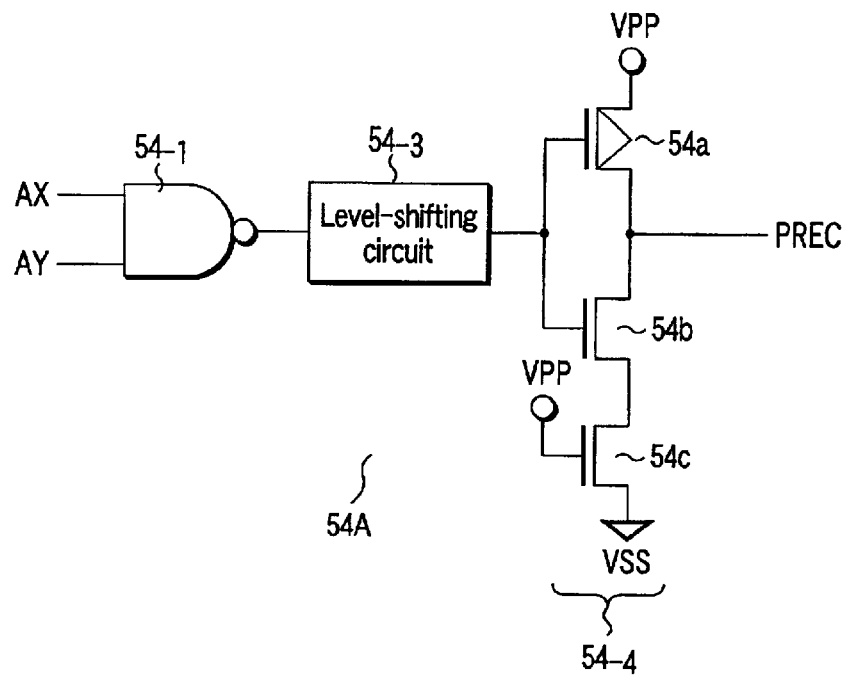
FIGS. 21A and 21B are circuit diagrams showing examples of conventional precharge signal-generating circuits.

As shown in FIG. 21A, the precharge signal-generating circuit 54A operates on boosted voltage VPP. When this boosted voltage VPP is applied between the source and drain of N-channel transistor 54b, hot carriers are injected, resulting in an increase in the threshold value of N-channel transistor 54b and a decrease in the amount of drain current. These adverse effects on N-channel transistor 54b increase exponentially in accordance with an increase in the source-drain voltage (Vds). To prevent or suppress the adverse effects the N-channel transistor 54b may suffer due to an increase in the number of hot carriers, a voltage-relaxing transistor 54c is connected in series to N-channel transistor 54b to which the boosted voltage VPP is applied, as described above. The third embodiment is featured by dividing such voltage-relaxing transistor 54c into circuits and distributively arranging the circuits in a row decoder section 21.

Of the structural elements of the precharge signal-generating circuit 54A of the third embodiment shown in FIG. 3, N-channel transistor 54c constituting part of the inverter circuit 54-4 is divided into circuits distributively arranged in the row decoder section 21, with the other structural elements being located in the control circuit section 51. Assuming that the size of the N-channel transistor 54c is W and the number of row decoders 21a is n, a plurality of N-channel transistors 54c' having a size defined by W/n are arranged in the row decoders 21a in an array. The boosted voltage VPP is applied to the gates of N-channel transistors 54c' as fixed voltage.

Where the boosted voltage VPP is used as in the third embodiment, only N-channel transistor 54c constituting the last inverter circuit 54-4 is divided into circuits distributively arranged in the row decoder section 21, with the other structural elements of the precharge signal-generating circuit 54A being located in the control circuit section 51. With this configuration, the control circuit section 51 need not be increased in area, and advantages similar to those of the first and second embodiments can be attained. That is, even if the number of circuits to be laid out in the control circuit section 51 is large, the chip size does not have to be increased in accordance with an increase in the area of the control circuit section 51.

(Fourth Embodiment)

Figure 4:
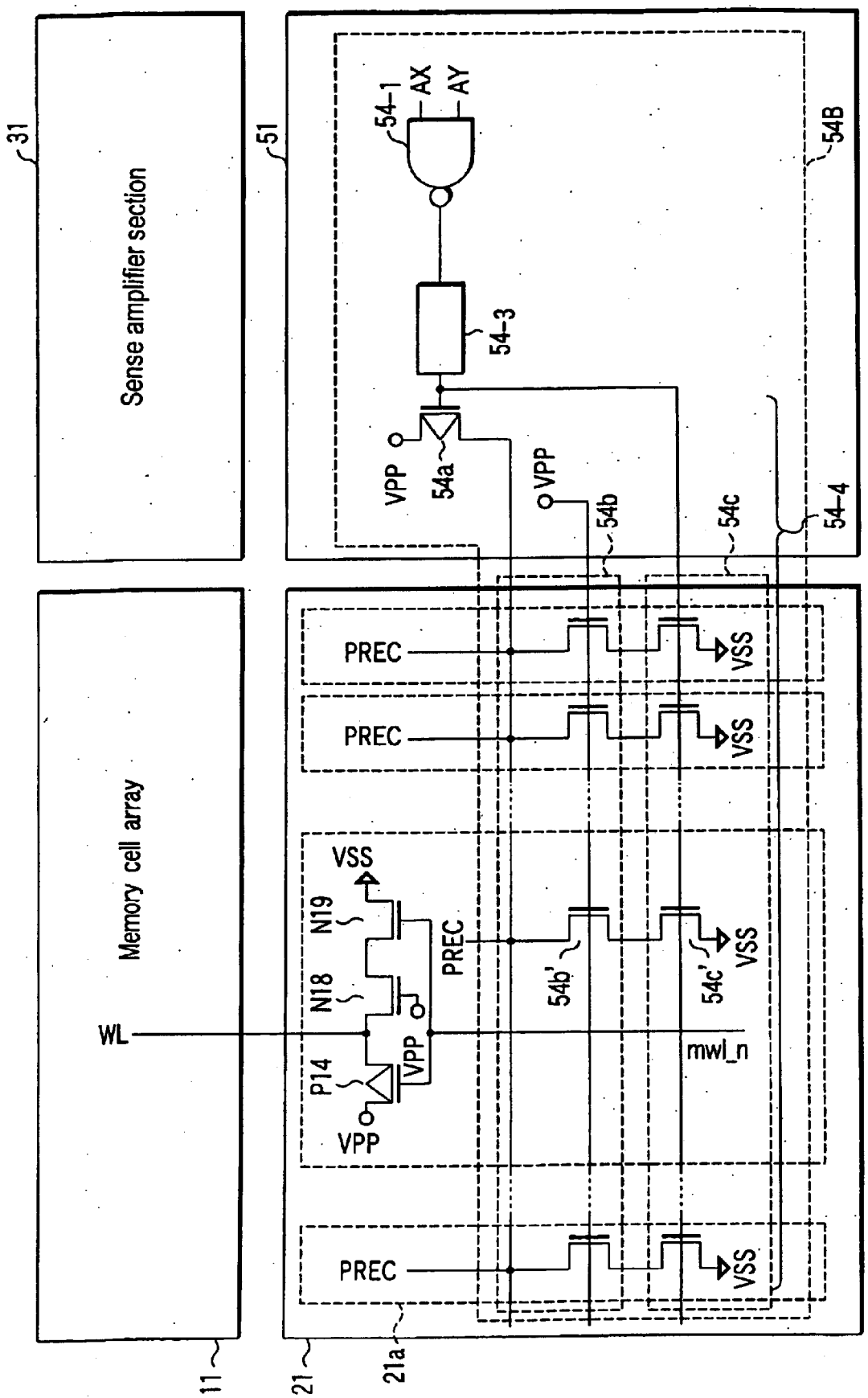
FIG. 4 is a circuit block diagram showing an example of a DRAM according to the fourth embodiment of the present invention.

FIG. 4 shows an example of a semiconductor memory device according to the fourth embodiment of the present invention. In the description below, reference will be made to a CMOS-type DRAM whose core portion is made by dividing part of a precharge signal-generating circuit 54B (which is a control circuit for controlling row decoders) into circuits and distributively arranging the circuits in a row decoder section. Since the fundamental configuration of the core portion is similar to that of the device shown in FIG. 1, what is shown in FIG. 4 is limited to the major structural elements, for the sake of simplicity.

Figure 21B:
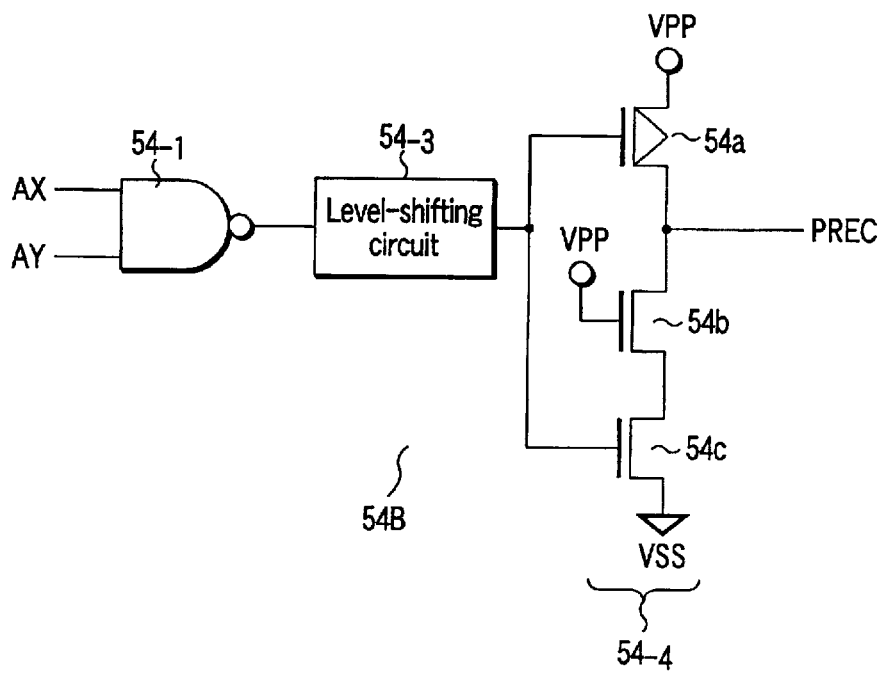

Of the structural elements of the precharge signal-generating circuit 54B of the fourth embodiment, each of N-channel transistors 54b and 54c constituting part of the inverter circuit 54-4 is divided into circuits distributively arranged in the row decoder section 21 in arrays, with the other structural elements of the precharge signal-generating circuit 54B being located in the control circuit section 51. (With respect to a precharge signal-generating circuit 54B, refer to FIG. 21B.) Assuming that the size of the N-channel transistor 54b is Wa and the number of row decoders 21a is n, a plurality of N-channel transistors 54b' having a size defined by Wa/n are arranged in the row decoders 21a. Assuming that the size of the N-channel transistor 54c is Wb and the number of row decoders 21a is n, a plurality of N-channel transistors 54c' having a size defined by Wb/n are arranged in the row decoders 21a. The boosted voltage VPP is applied to the gates of N-channel transistors 54b' as fixed voltage.

Where the boosted voltage VPP is used as in the fourth embodiment, only N-channel transistors 54b and 54c constituting the last inverter circuit 54-4 are each divided into circuits distributively arranged in the row decoder section 21, with the other structural elements of the precharge signal-generating circuit 54B being located in the control circuit section 51. With this configuration, the control circuit section 51 need not be increased in area, and advantages similar to those of the first to third embodiments can be attained. That is, even if the number of circuits to be laid out in the control circuit section 51 is large, the chip size does not have to be increased in accordance with an increase in the area of the control circuit section 51.

Of the three transistors 54a, 54b and 54c constituting the last inverter circuit 54-4, two N-channel transistors 54b and 54c are each divided into circuits distributively arranged in the row decoder section 21. In comparison with the third embodiment, this configuration is effective in reducing the layout area of the control circuit section 51.

(Fifth Embodiment)

Figure 5:
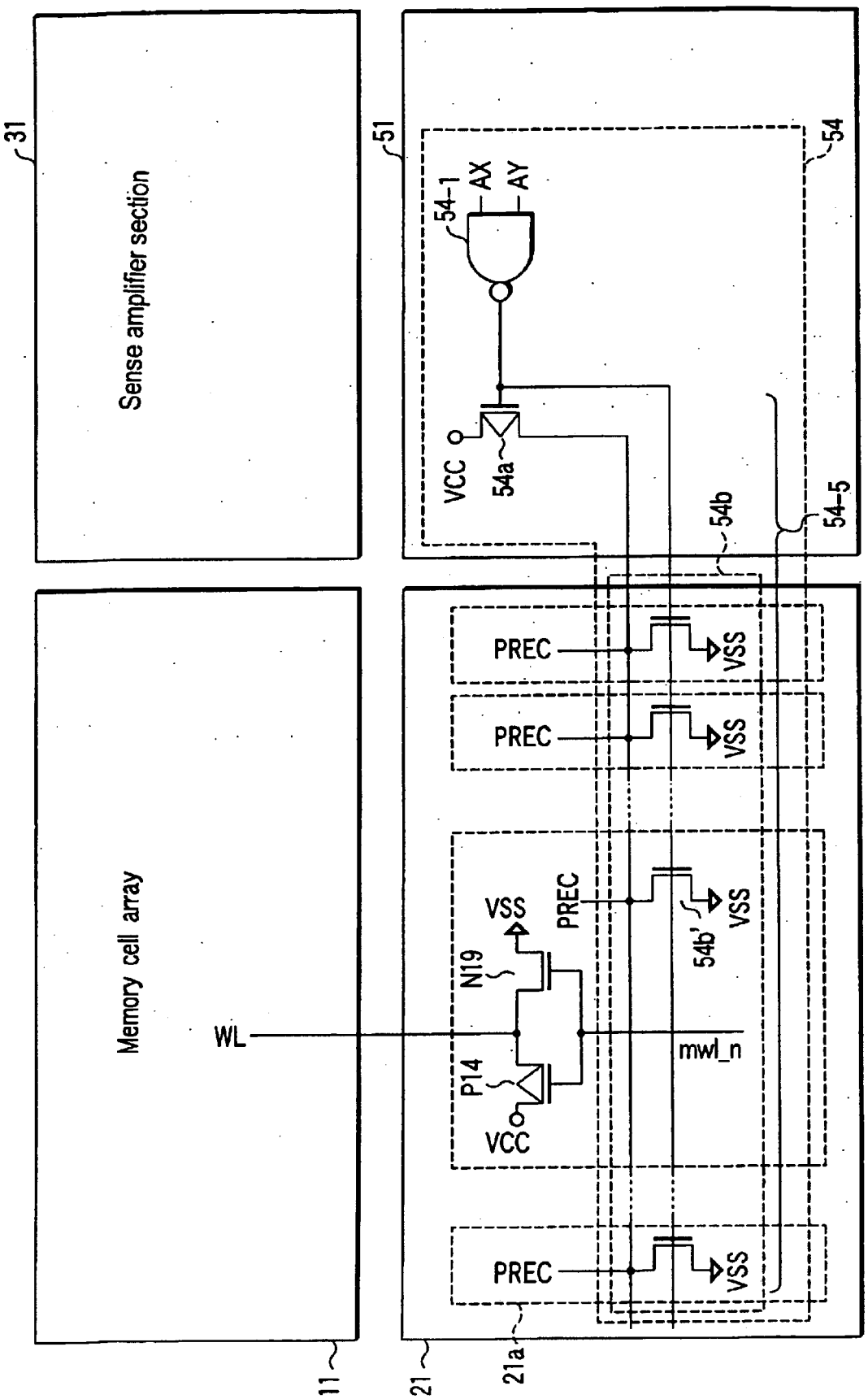
FIG. 5 is a circuit block diagram showing an example of a DRAM according to the fifth embodiment of the present invention.

FIG. 5 shows an example of a semiconductor memory device according to the fifth embodiment of the present invention. In the description below, reference will be made to a CMOS-type DRAM whose core portion is made by dividing part of a precharge signal-generating circuit 54 (which is a control circuit for controlling row decoders) into circuits and distributively arranging the circuits in a row decoder section. Since the fundamental configuration of the core portion is similar to that of the device shown in FIG. 1, what is shown in FIG. 5 is limited to the major structural elements, for the sake of simplicity.

Figure 18:
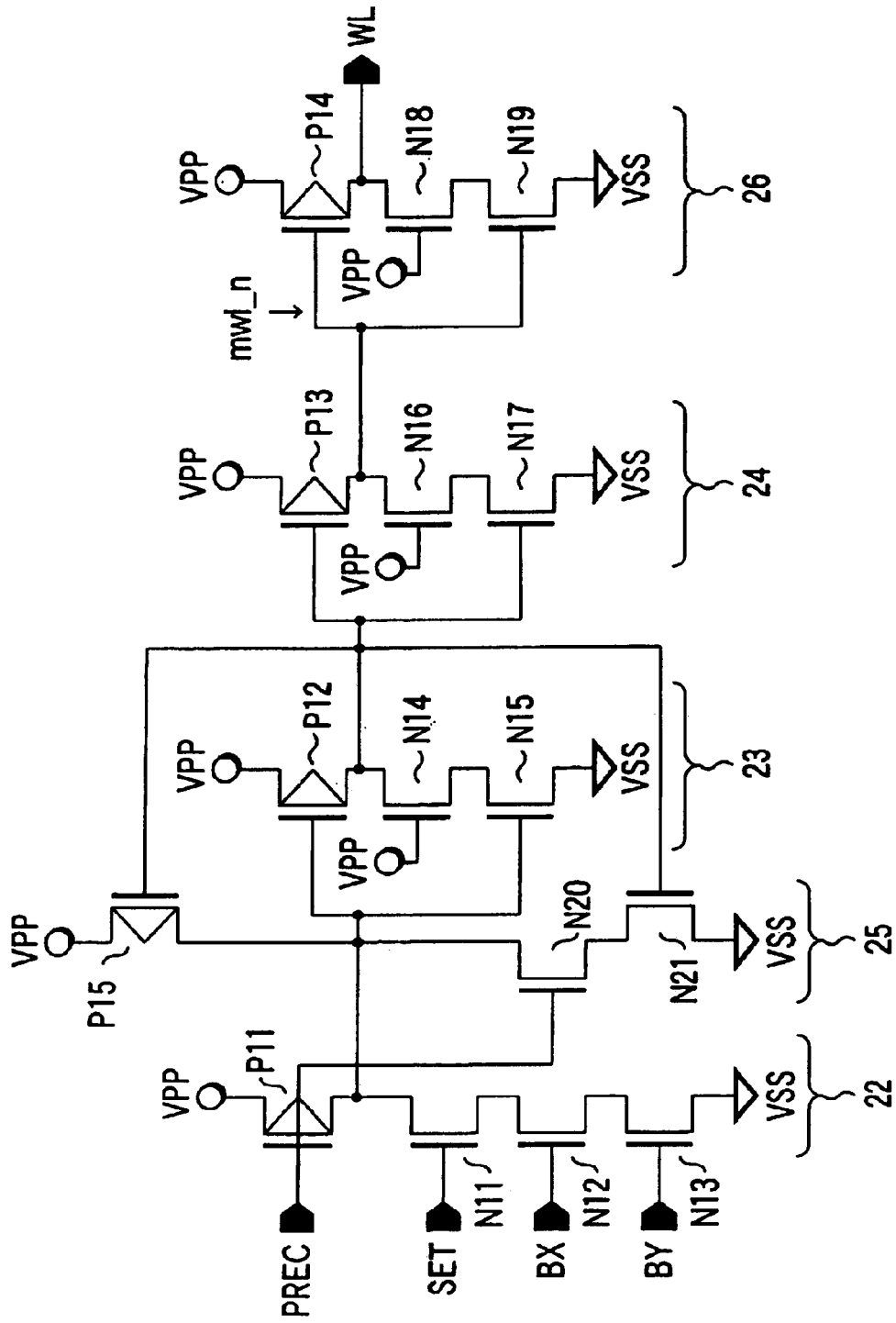
FIG. 18 is a circuit diagram showing an example of a conventional row decoder.

Each row decoder 21a may be configured in the manner shown in FIG. 18. That is, it may comprise: a pre-driver circuit 23 including one P-channel transistor P12 and one N-channel transistor N15; another pre-driver circuit 24 including P-channel transistor P13 and one N-channel transistor N17; and one word line-driver circuit 26 including one P-channel transistor P14 and one N-channel transistor N19.

The precharge signal-generating circuit 54, which does not use the boosted voltage VPP, comprises a 2-input NAND circuit 54-1 and one inverter circuit 54-5. Inverter circuit 54-5 is of a CMOS circuit operating on the internal power supply voltage VCC and includes one P-channel transistor 54a and one N-channel transistor 54b.

Of the structural elements of the precharge signal-generating circuit 54 of the fifth embodiment, N-channel transistor 54b constituting part of the inverter circuit 54-5 is divided into circuits distributively arranged in the row decoder section 21 in an array, with the other structural elements of the precharge signal-generating circuit 54 being located in the control circuit section 51. Assuming that the size of the N-channel transistor 54b is W and the number of row decoders 21a is n, a plurality of N-channel transistors 54b' having a size defined by W/n are arranged in the row decoders 21a.

The fifth embodiment does not use the boosted voltage VPP. Even in this case, only the N-channel transistor 54b constituting the last inverter circuit 54-5 is divided into circuits distributively arranged in the row decoder section 21, with the other structural elements of the precharge signal-generating circuit 54 being arranged in the control circuit section 51. With this configuration, the control circuit section 51 need not be increased in area, and advantages similar to those of the first to fourth embodiments can be attained. That is, even if the number of circuits to be laid out in the control circuit section 51 is large, the chip size does not have to be increased in accordance with an increase in the area of the control circuit section 51.

(Sixth Embodiment)

Figure 6:
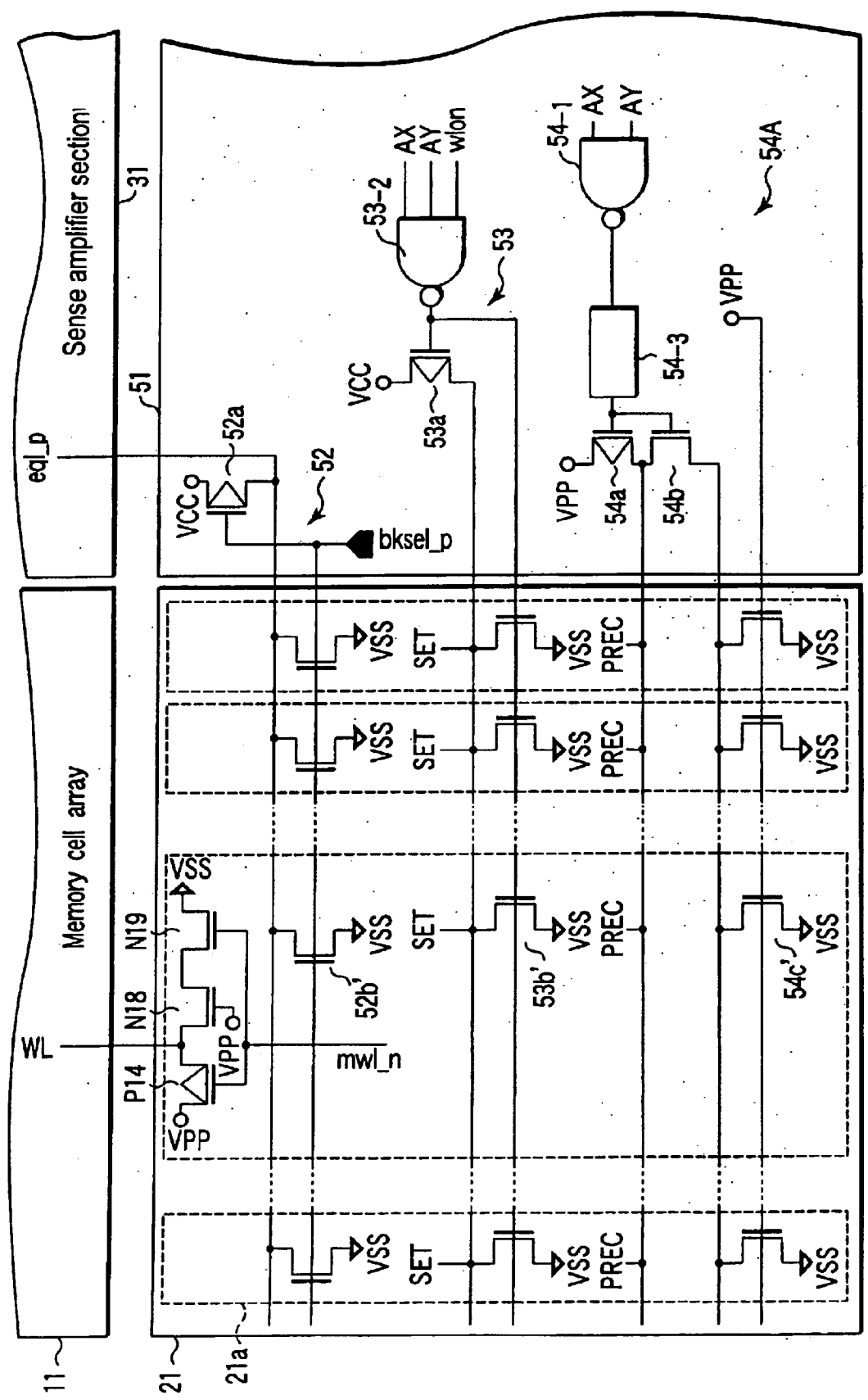
FIG. 6 is a circuit block diagram showing an example of a DRAM according to the sixth embodiment of the present invention.

FIG. 6 shows an example of a semiconductor memory device according to the sixth embodiment of the present invention. Since the fundamental configuration of the core portion of the CMOS-type DRAM of the sixth embodiment is similar to the configuration shown in FIG. 1, what is shown in FIG. 6 is limited to the major structural elements, for the sake of simplicity.

In the first embodiment described above, part of the equalize signal-generating circuit 52 is divided into circuits distributively arranged in the row decoder section 21. Likewise, in the second to fifth embodiments, part of the setting signal-generating circuit 53 (second embodiment), part of precharge signal-generating circuit 54A (third embodiment), part of precharge signal-generating circuit 54B (fourth embodiment) and part of precharge signal-generating circuit 54 (fifth embodiment) are each divided into circuits distributively arranged in the row decoder section 21. However, these embodiments in no way restrict the present invention. For example, part of the equalize signal-generating circuit 52, part of the setting signal-generating circuit 53 and part of precharge signal-generating circuit 54A each may be divided into circuits distributively arranged in an array in the row decoder section 21.

As shown in FIG. 6, the N-channel transistor 52b of the inverter circuit of the equalize signal-generating circuit 52 of the sixth embodiment is divided into transistors 52b' having a size of W/n, and these transistors 52b' are arranged in row decoders 21a. In addition, the N-channel transistor 53b of the inverter circuit 53-1 of the setting signal-generating circuit 53 is divided into transistors 53b' having a size of W/n, and these transistors 53b' are also arranged in the row decoders 21a. Furthermore, the N-channel transistor 54c of the inverter circuit 54-4 of the precharge signal-generating circuit 54A is divided into transistors 54c' having a size of W/n, and these transistors 54c' are also arranged in the row decoders 21a.

As described above, the N-channel transistor 52b of the inverter circuit which is part of the equalize signal-generating circuit 52, the N-channel transistor 53b of the inverter circuit 53-1 which is part of the setting signal-generating circuit 53 and the N-channel transistor 54c of the inverter circuit 54-4 which is part of the precharge signal-generating circuit 54A, are each divided into circuits distributively arranged in arrays in the row decoder section 21. With this configuration, the control circuit section 51 need not be increased in area. The chip size does not have to be increased in accordance with an increase in the area of the control circuit section 51.

(Seventh Embodiment)

Figure 7:
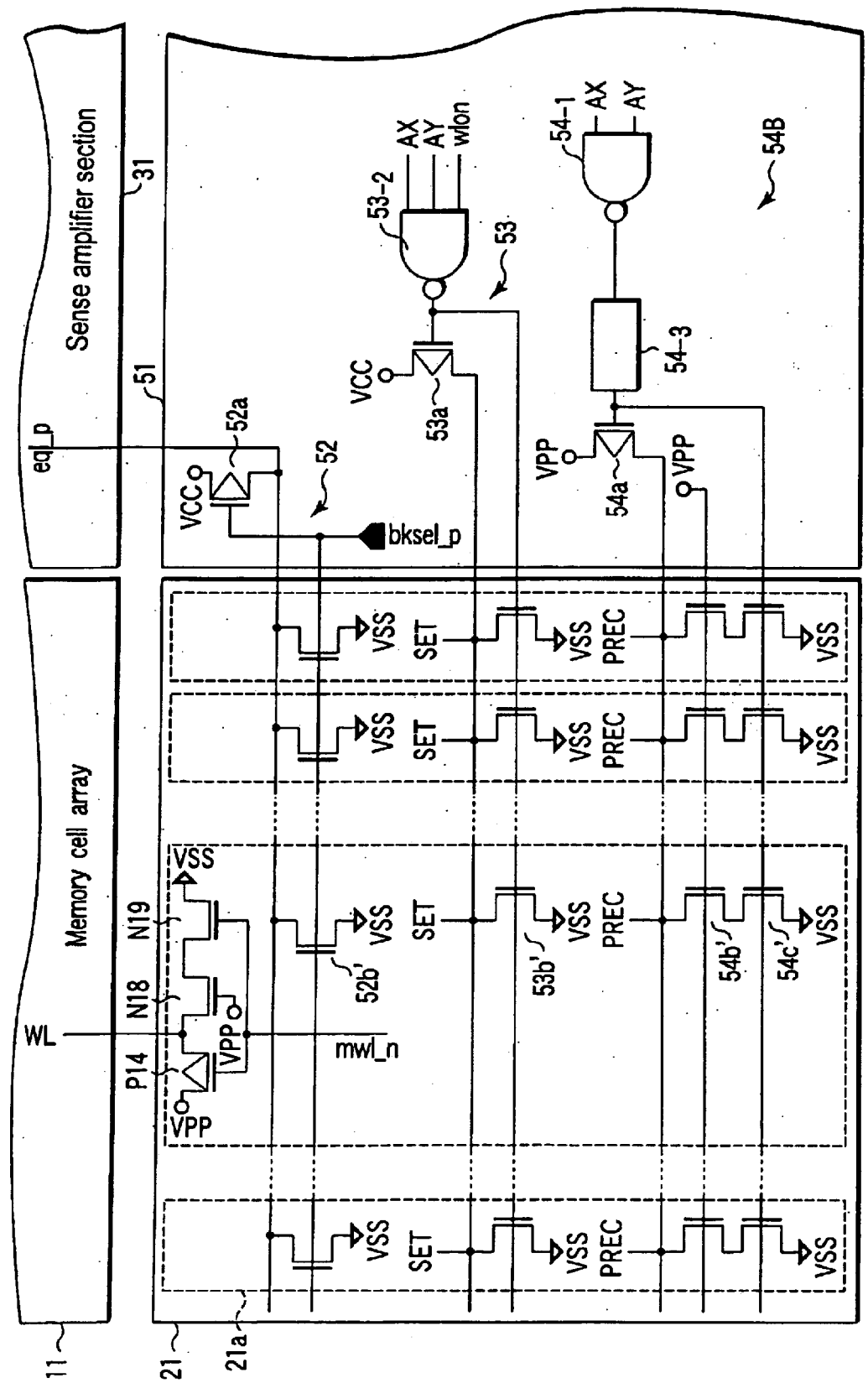
FIG. 7 is a circuit block diagram showing an example of a DRAM according to the seventh embodiment of the present invention.

FIG. 7 shows an example of a semiconductor memory device according to the seventh embodiment of the present invention. Since the fundamental configuration of the core portion of the CMOS-type DRAM of the seventh embodiment is similar to the configuration shown in FIG. 1, what is shown in FIG. 7 is limited to the major structural elements, for the sake of simplicity.

According to the seventh embodiment, the N-channel transistor 52b of the inverter circuit of the equalize signal-generating circuit 52 is divided into transistors 52b' having a size of W/n, and these transistors 52b' are arranged in row decoders 21a. In addition, the N-channel transistor 53b of the inverter circuit 53-1 of the setting signal-generating circuit 53 is divided into transistors 53b' having a size of W/n, and these transistors 53b' are also arranged in the row decoders 21a. Furthermore, the N-channel transistors 54b and 54c of the inverter circuit 54-4 of the precharge signal-generating circuit 54B is divided into transistors 54b' and 54c' having a size of W/n, and these transistors 54b' and 54c' are also arranged in the row decoders 21a.

With this configuration, advantages similar to those of the sixth embodiment can be attained. That is, an increase in the area of the control circuit section 51 can be remarkably prevented, and the chip size does not have to be increased in accordance therewith.

(Eighth Embodiment)

Figure 8:
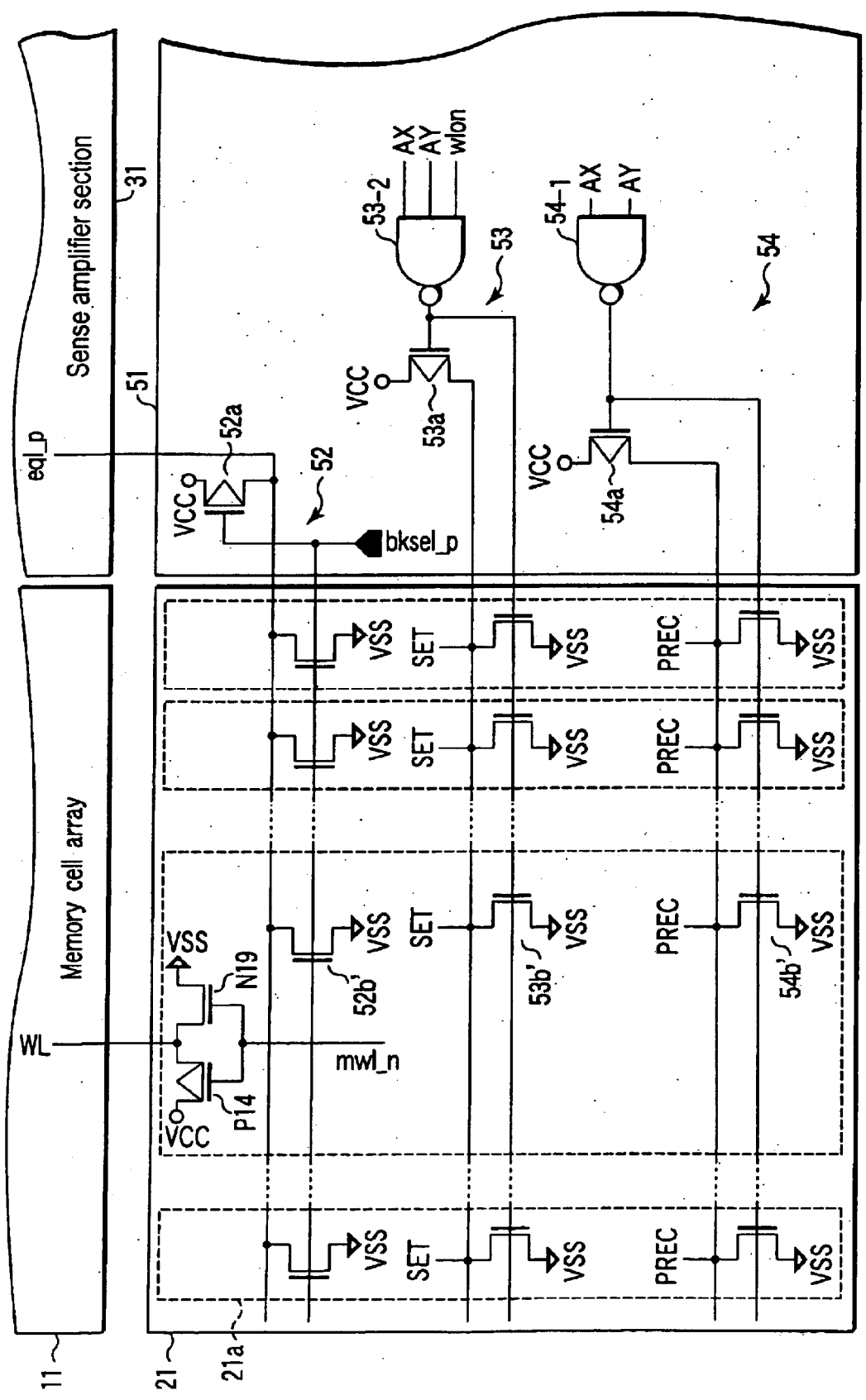
FIG. 8 is a circuit block diagram showing an example of a DRAM according to the eighth embodiment of the present invention.
Figure 9:
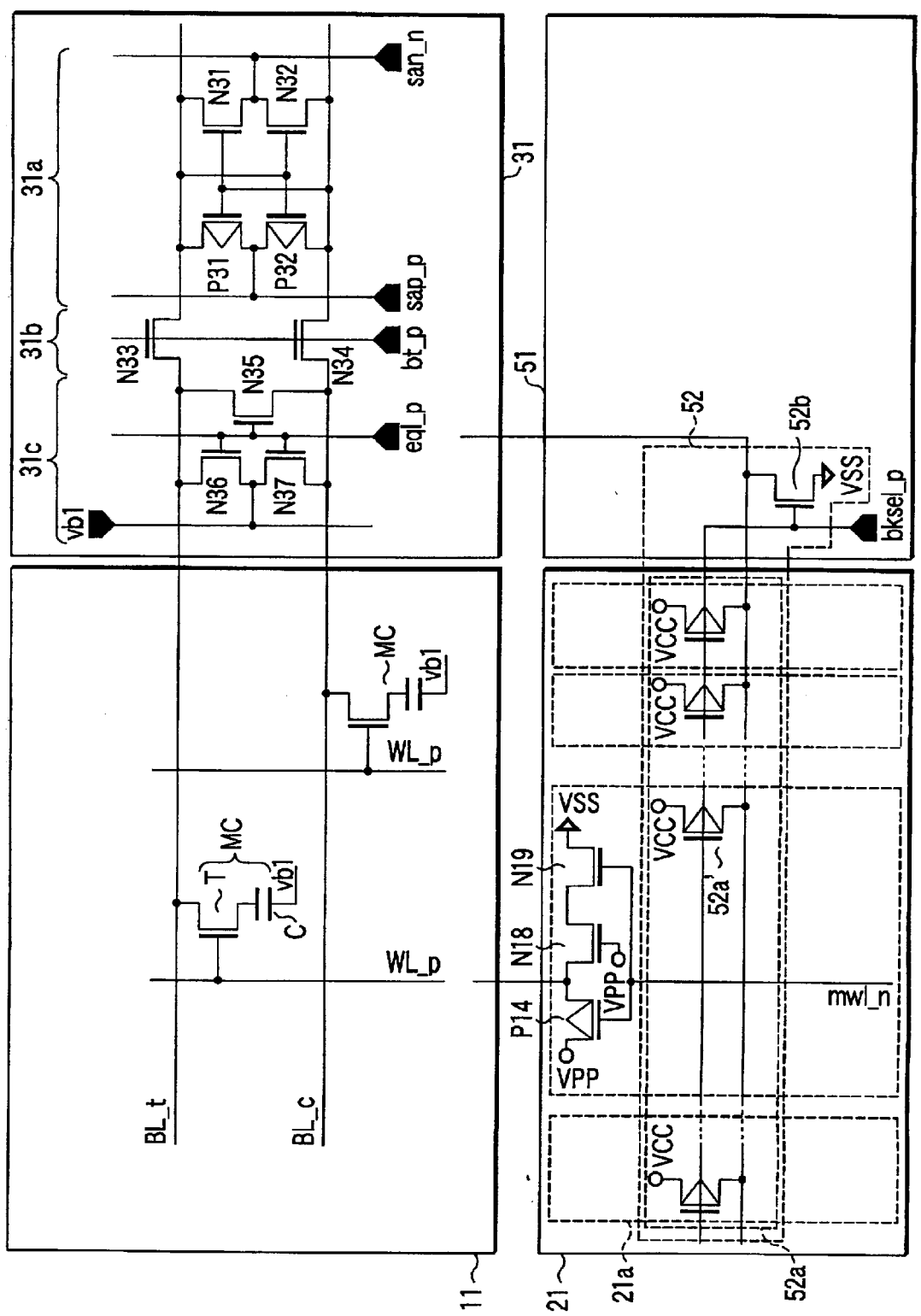
FIG. 9 is a circuit block diagram showing another example of the DRAM shown in FIG. 1.
Figure 10:
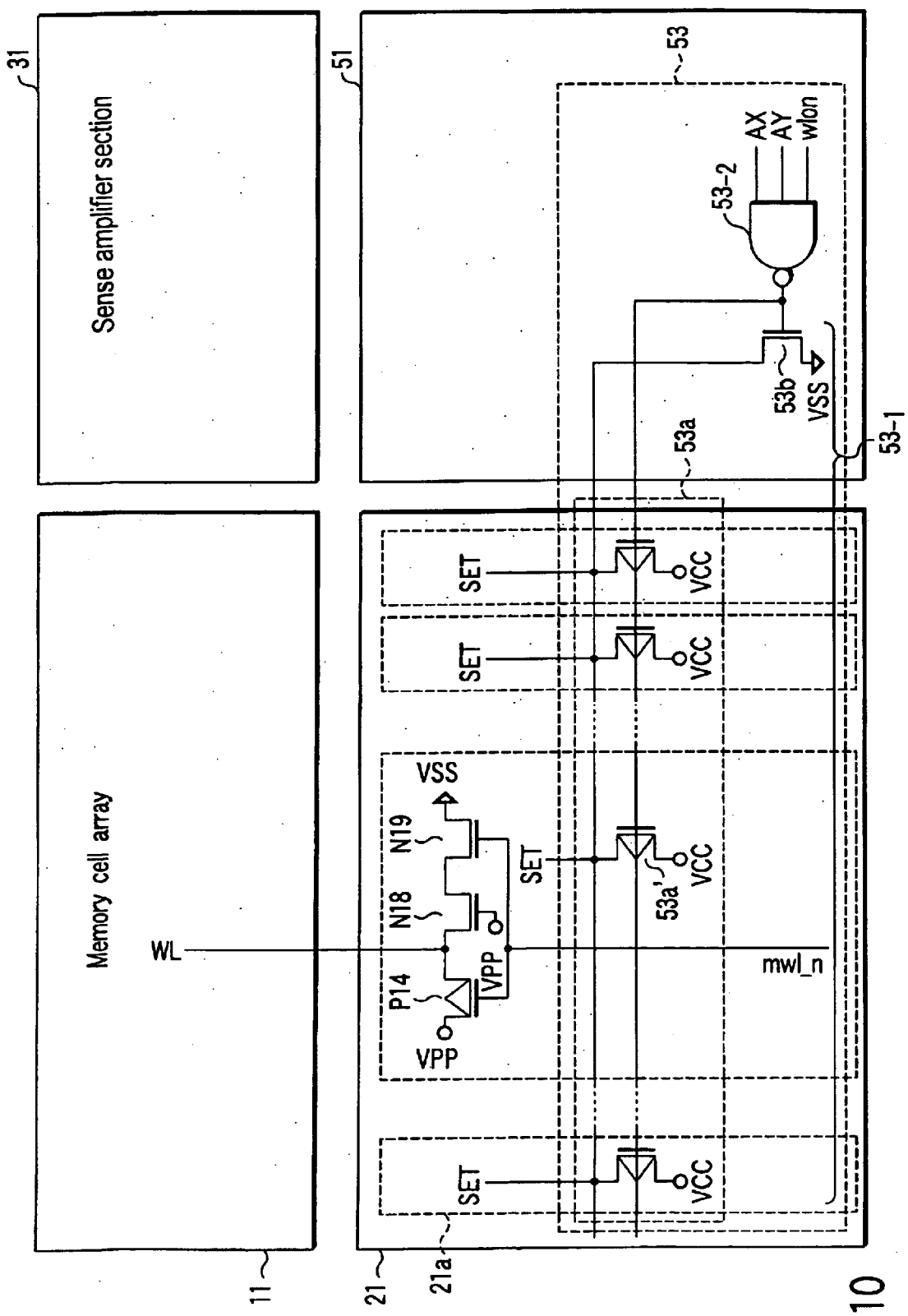
FIG. 10 is a circuit block diagram showing another example of the DRAM shown in FIG. 2.
Figure 11:
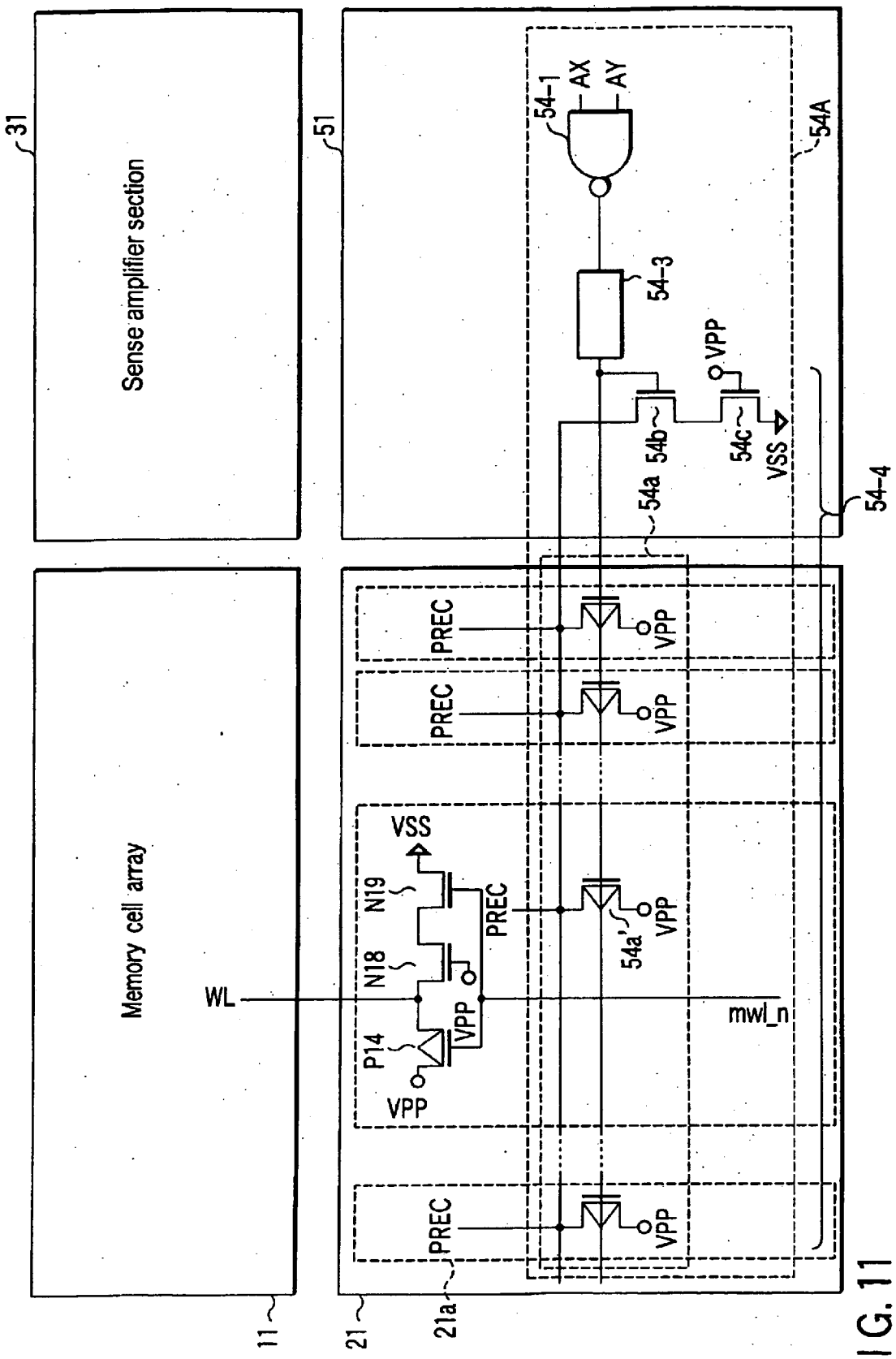
FIG. 11 is a circuit block diagram showing another example of the DRAM shown in FIG. 3.
Figure 12:
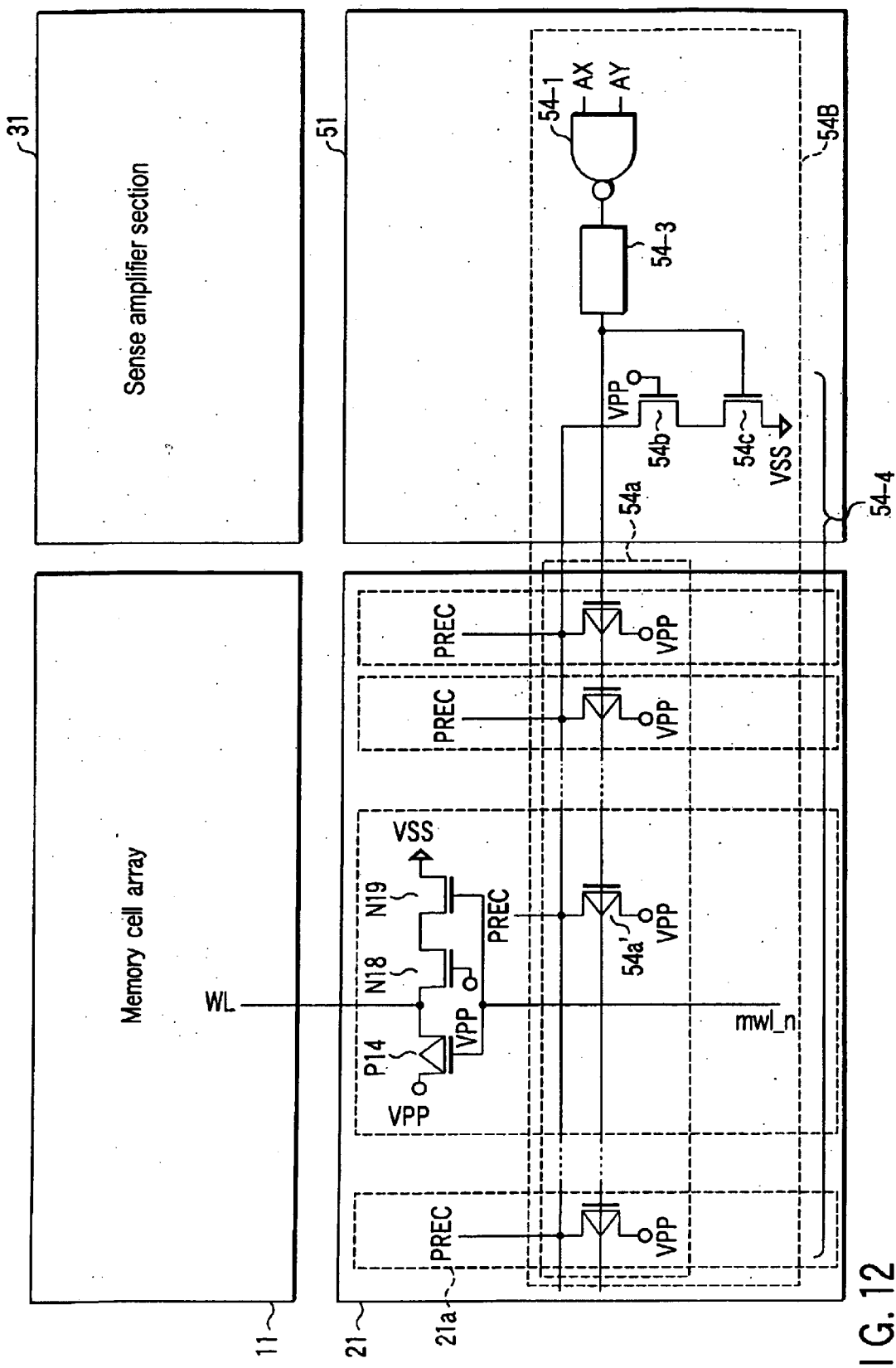
FIG. 12 is a circuit block diagram showing another example of the DRAM shown in FIG. 4.
Figure 14:
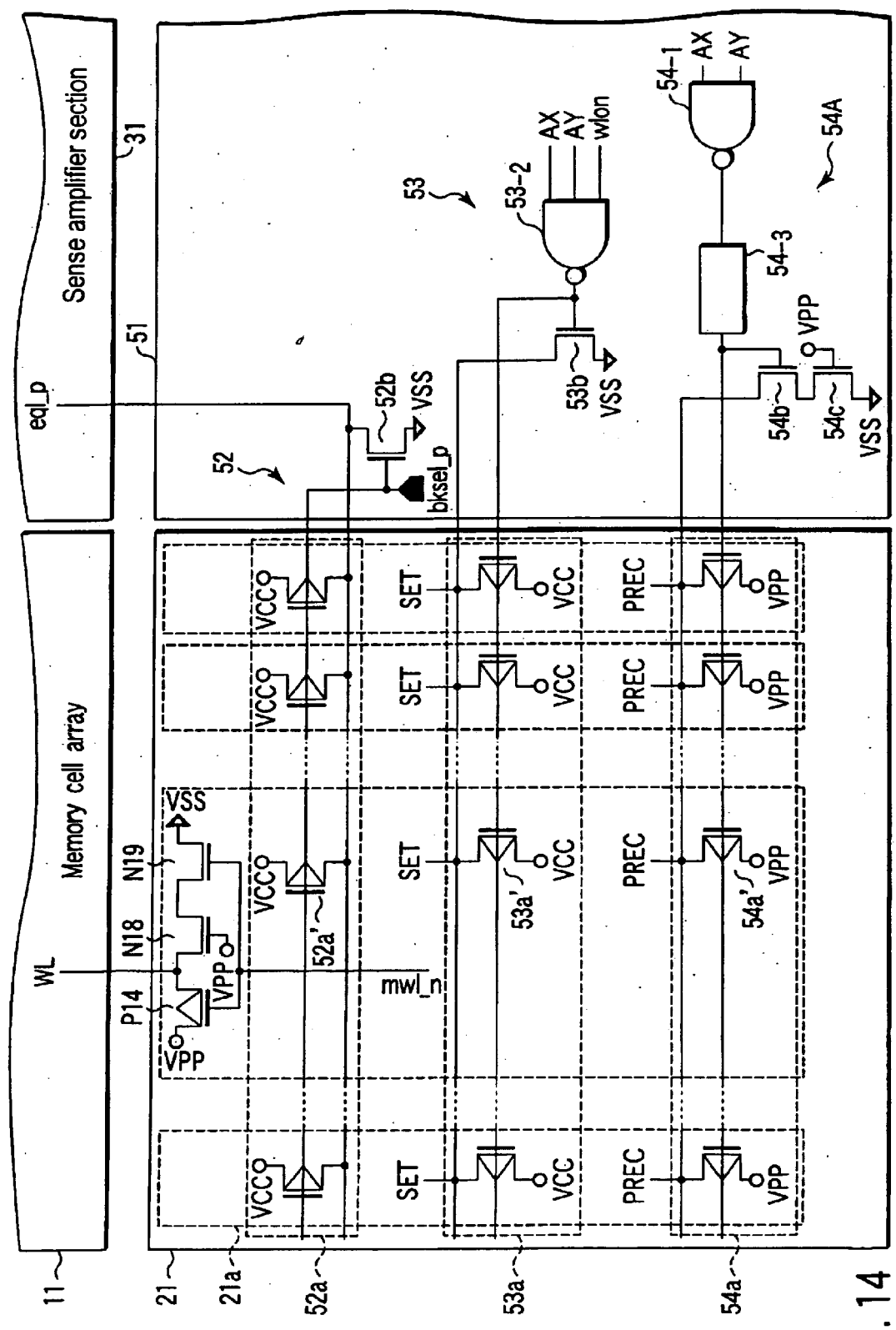
FIG. 14 is a circuit block diagram showing another example of the DRAM shown in FIG. 6.
Figure 16:
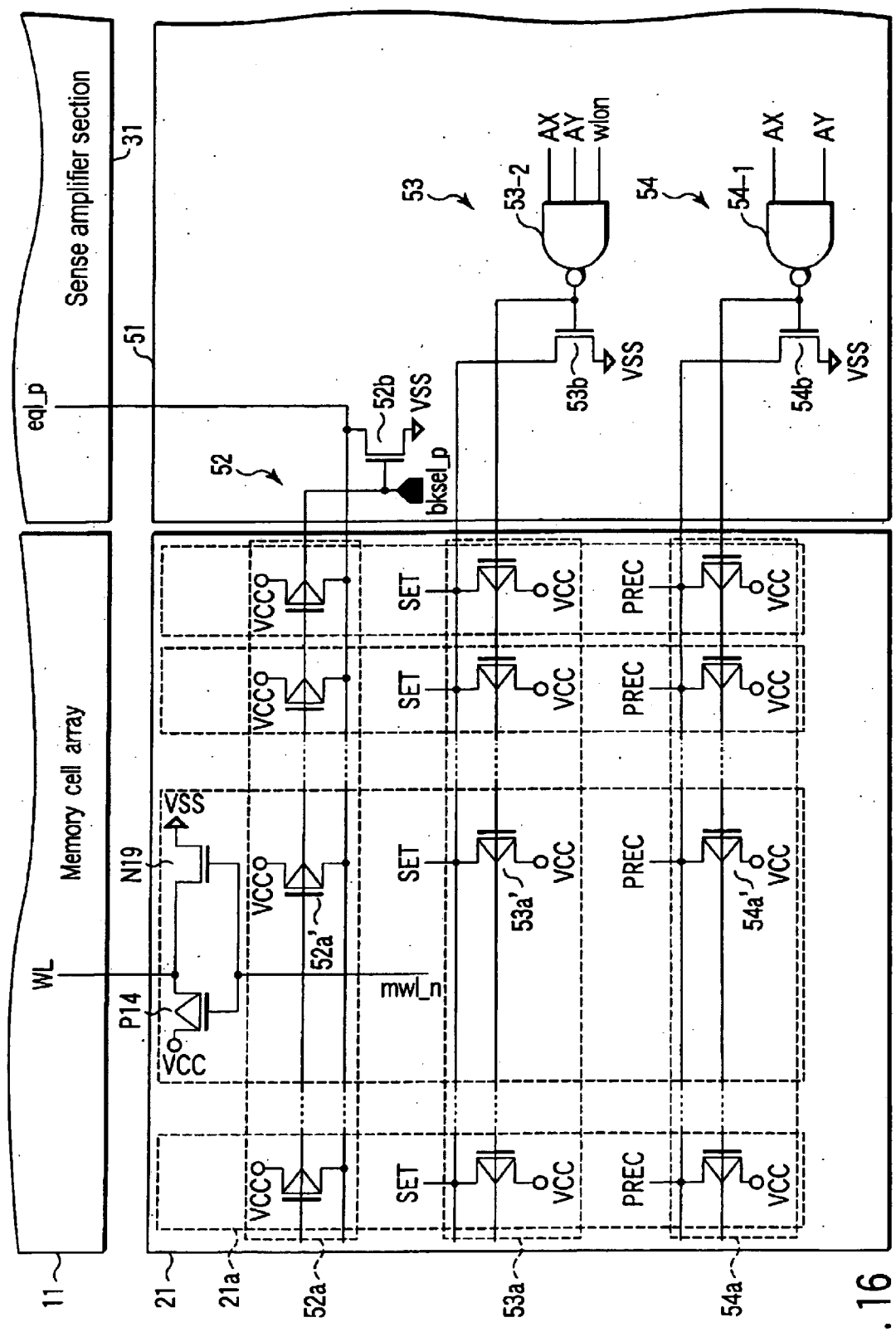
FIG. 16 is a circuit block diagram showing another example of the DRAM shown in FIG. 8.

FIG. 8 shows an example of a semiconductor memory device according to the eighth embodiment of the present invention. Since the fundamental configuration of the core portion of the CMOS-type DRAM of the eighth embodiment is similar to the configuration shown in FIG. 1, what is shown in FIG. 8 is limited to the major structural elements, for the sake of simplicity.

According to the eighth embodiment, the N-channel transistor 52b of the inverter circuit of the equalize signal-generating circuit 52 is divided into transistors 52b' having a size of W/n, and these transistors 52b' are arranged in row decoders 21a. In addition, the N-channel transistor 53b of the inverter circuit 53-1 of the setting signal-generating circuit 53 is divided into transistors 53b' having a size of W/n, and these transistors 53b' are also arranged in the row decoders 21a. Furthermore, the N-channel transistor 54b of the inverter circuit 54-5 of the precharge signal-generating circuit 54 is divided into transistors 54b' having a size of W/n, and these transistors 54b' are also arranged in the row decoders 21a.

With this configuration, advantages similar to those of the sixth and seventh embodiments can be attained. That is, an increase in the area of the control circuit section 51 can be remarkably prevented, and the chip size does not have to be increased in accordance therewith.

In the embodiments described above, N-channel transistors are distributively arranged. In place of this configuration, P-channel transistors may be distributively arranged as shown in FIGS. 9 to 16. FIGS. 9 to 16 correspond to FIGS. 1 to 8, respectively.

The above embodiments were described, referring to the case where the present invention was applied to DRAMs. The present invention is not limited to this, and may be applied to various types of semiconductor memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array including a plurality of memory cells which are arranged at intersections between a plurality of word lines and a plurality of bit lines;
   a row decoder section located adjacent to said memory cell array, said row decoder section including n decoder circuits which selectively drive said word lines;
   a control circuit section located adjacent to said row decoder section; and
   at least one control circuit having a first part arranged in said control circuit section and a second part arranged in said row decoder section, said second part of said at least one control circuit being divided into n transistors which are distributively arranged in said n decoder circuits.

2. A semiconductor memory device according to claim 1, wherein said n transistors are equal in size.

3. A semiconductor memory device according to claim 1, wherein said n transistors have a signal amplitude level equal to that of said plurality of decoder circuits.

4. A semiconductor memory device comprising:
   a memory cell array including a plurality of memory cells which are arranged at intersections between a plurality of word lines and a plurality of bit lines;
   a row decoder section located adjacent to said memory cell array, said row decoder section including a plurality of decoder circuits which selectively drive said word lines;
   a control circuit section located adjacent to said row decoder section; and
   at least one control circuit having a first part arranged in said control circuit section and a second part arranged in said row decoder section, said second part of said at least one control circuit being divided into circuits which are distributively arranged in said plurality of decoder circuits,
   wherein said at least one control circuit includes one of: a setting signal-generating circuit which sets said plurality of decoder circuits; a precharge signal-generating circuit which precharges said plurality of decoder circuits; and an equalize signal-generating circuit which causes a bit line equalizer circuit of a sense amplifier section to perform an equalize operation, and
   said second part of at least one control circuit includes P-channel transistors of complementary metal oxide semiconductor type inverter circuits of said setting signal-generating circuit, precharge signal-generating circuit and equalize signal-generating circuit.

5. A semiconductor memory device according to claim 4, wherein said inverter circuits use a predetermined internal power supply voltage as a power supply voltage.

6. A semiconductor memory device according to claim 4, wherein said inverter circuits use a boosted voltage higher than an internal power supply voltage as a power supply voltage.

7. A semiconductor memory device comprising:
   a memory cell array including a plurality of memory cells which are arranged at intersections between a plurality of word lines and a plurality of bit lines;
   a row decoder section located adjacent to said memory cell array, said row decoder section including a plurality of decoder circuits which selectively drive said word lines;
   a control circuit section located adjacent to said row decoder section; and
   at least one control circuit having a first part arranged in said control circuit section and a second part arranged in said row decoder section, said second part of said at least one control circuit being divided into circuits which are distributively arranged in said plurality of decoder circuits.
   wherein said at least one control circuit includes one of: a setting signal-generating circuit which sets said plurality of decoder circuits; a precharge signal-generating circuit which precharges said plurality of decoder circuits; and an equalize signal-generating circuit which causes a bit line equalizer circuit of a sense amplifier section to perform an equalize operation, and
   said second part of at least one control circuit includes N-channel transistors of complementary metal oxide semiconductor type inverter circuits of said setting signal-generating circuit, precharge signal-generating circuit and equalize signal-generating circuit.

8. A semiconductor memory device according to claim 7, wherein said inverter circuits use a predetermined internal power supply voltage as a power supply voltage.

9. A semiconductor memory device according to claim 7, wherein said inverter circuits use a boosted voltage higher than an internal power supply voltage as a power supply voltage.

10. A semiconductor memory device according to claim 7, wherein said N-channel transistors are voltage-relaxing transistors.

11. A semiconductor memory device according to claim 10, wherein said N-channel transistors include gates to which a boosted voltage higher than an internal power supply voltage is applied.

12. A semiconductor memory device according to claim 10, wherein said N-channel transistors include gates whose potential is fixed.

13. A semiconductor memory device comprising:

a memory cell array including a plurality of memory cells which are arranged at intersections between a plurality of word lines and a plurality of bit lines;

a row decoder section located adjacent to said memory cell array, said row decoder section including a plurality of decoder circuits which selectively drive said word lines;

a control circuit section located adjacent to said row decoder section; and at least one control circuit having a first part arranged in said control circuit section and a second part arranged in said row decoder section, said second part of said at least one control circuit being divided into circuits which are distributively arranged in said plurality of decoder circuits, wherein said at least one control circuit includes: a setting signal-generating circuit which sets said plurality of decoder circuits; a precharge signal-generating circuit which precharges said plurality of decoder circuits; and an equalize signal-generating circuit which causes a bit line equalizer circuit of a sense amplifier section to perform an equalize operation, and said second part of at least one control circuit includes P-channel transistors of complementary metal oxide semiconductor type inverter circuits of said setting signal-generating circuit, precharge signal-generating circuit and equalize signal-generating circuit.

14. A semiconductor memory device according to claim 13, wherein said inverter circuits use a predetermined internal power supply voltage as a power supply voltage.

15. A semiconductor memory device according to claim 13, wherein said inverter circuits use a boosted voltage higher than an internal power supply voltage as a power supply voltage.

16. A semiconductor memory device comprising:

a memory cell array including a plurality of memory cells which are arranged at intersections between a plurality of word lines and a plurality of bit lines;

a row decoder section located adjacent to said memory cell array, said row decoder section including a plurality of decoder circuits which selectively drive said word lines;

a control circuit section located adjacent to said row decoder section; and at least one control circuit having a first part arranged in said control circuit section and a second part arranged in said row decoder section, said second part of said at least one control circuit being divided into circuits which are distributively arranged in said plurality of decoder circuits, wherein said at least one control circuit includes: a setting signal-generating circuit which sets said plurality of decoder circuits; a precharge signal-generating circuit which precharges said plurality of decoder circuits; and an equalize signal-generating circuit which causes a bit line equalizer circuit of a sense amplifier section to perform an equalize operation, and said second part of at least one control circuit includes N-channel transistors of complementary metal oxide semiconductor type inverter circuits of said setting signal-generating circuit, precharge signal-generating circuit and equalize signal-generating circuit.

17. A semiconductor memory device according to claim 16, wherein said inverter circuits use a predetermined internal power supply voltage as a power supply voltage.

18. A semiconductor memory device according to claim 16, wherein said inverter circuits use a boosted voltage higher than an internal power supply voltage as a power supply voltage.

19. A semiconductor memory device according to claim 16, wherein said N-channel transistors are voltage-relaxing transistors.

20. A semiconductor memory device according to claim 19, wherein said N-channel transistors include gates to which a boosted voltage higher than an internal power supply voltage is applied.

21. A semiconductor memory device according to claim 19, wherein said N-channel transistors include gates whose potential is fixed.

* * * * *